(12) United States Patent
Kurokawa et al.

(10) Patent No.: US 6,711,017 B2
(45) Date of Patent: Mar. 23, 2004

(54) COOLING APPARATUS FOR ELECTRONIC UNIT

(75) Inventors: Tateki Kurokawa, Musashino (JP); Akira Saito, Tokyo (JP); Toshio Fukukawa, Iruma (JP); Mikio Harada, Iruma (JP); Takahiro Daikoku, Ushiku (JP); Hideo Yazawa, Hamura (JP)

(73) Assignees: Hitachi Kokusai Electric Inc., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 10/196,284

(22) Filed: Jul. 17, 2002

(65) Prior Publication Data

US 2003/0016498 A1 Jan. 23, 2003

(30) Foreign Application Priority Data

Jul. 17, 2001 (JP) ........................... 2001-217280
Jul. 17, 2001 (JP) ........................... 2001-217281
Jul. 17, 2001 (JP) ........................... 2001-217282
Jul. 17, 2001 (JP) ........................... 2001-217283

(51) Int. Cl.[7] ................................................ H05K 7/20
(52) U.S. Cl. ................. 361/699; 62/259.2; 165/104.33; 257/714
(58) Field of Search ........................ 361/698–700, 361/702, 704, 705, 707, 717–719; 62/259.2; 174/15.1; 257/713–715; 165/80.3, 80.4, 185, 208, 209, 104.19, 104.28, 104.33

(56) References Cited

U.S. PATENT DOCUMENTS 5,821,505 A * 10/1998 Tustaniwskyj et al. ..... 219/494
5,829,516 A * 11/1998 Lavochkin ................. 165/80.4
5,918,665 A * 7/1999 Babcock et al. ......... 165/104.33
5,954,127 A * 9/1999 Chrysler et al. ............ 165/170
6,125,035 A * 9/2000 Hood, III et al. ........... 361/687
6,189,213 B1 * 2/2001 Kimura et al. ......... 29/890.035
6,226,178 B1 * 5/2001 Broder et al. ............... 361/687

FOREIGN PATENT DOCUMENTS

| JP | A-63-131469 | 6/1988 |
| JP | A-2-28965 | 2/1990 |
| JP | A-5-75284 | 3/1993 |
| JP | A-6-164178 | 6/1994 |
| JP | A-6-304739 | 11/1994 |
| JP | B2-2508640 | 4/1996 |
| JP | B2-2656581 | 5/1997 |
| JP | A-9-298377 | 11/1997 |

* cited by examiner

Primary Examiner—G. Tolin
(74) Attorney, Agent, or Firm—Antonelli, Terry, Stout & Kraus, LLP

(57) ABSTRACT

Provided is a cooling apparatus for feeding liquid coolant to electronic elements as heat generating elements in an electronic system through a cooling pipe. The cooling pipe is in part flattened so as to form flattened portion which is made into contact with the electronic parts for cooling the latter. With this arrangement, the pipe line working is simplified while the number of joint parts in the pipe line is decreased so as to prevent leakage of the liquid coolant. Further, the heat-exchange capacity of a heat-exchanger unit is controlled in accordance with an atmospheric temperature, a temperature in the electronic system and a temperature of the liquid coolant in order to aim at preventing occurrence of freezing or dewing while enhancing the operating efficiency. Further, in an electronic apparatus having two electronic systems, a liquid coolant tank is commonly used for two electronic systems in order to prevent occurrence of dewing or freezing in a cooling system for the electronic system on resting.

21 Claims, 19 Drawing Sheets

FIG. 3
FIG. 4
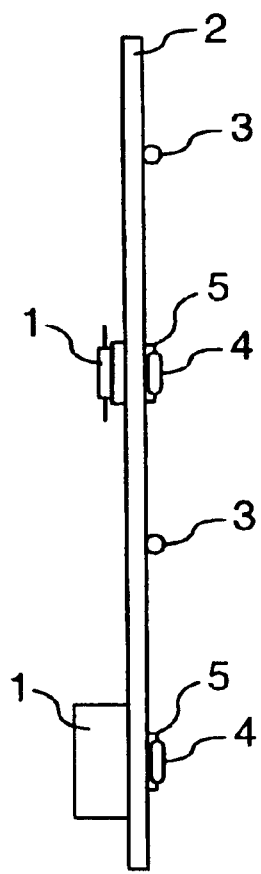
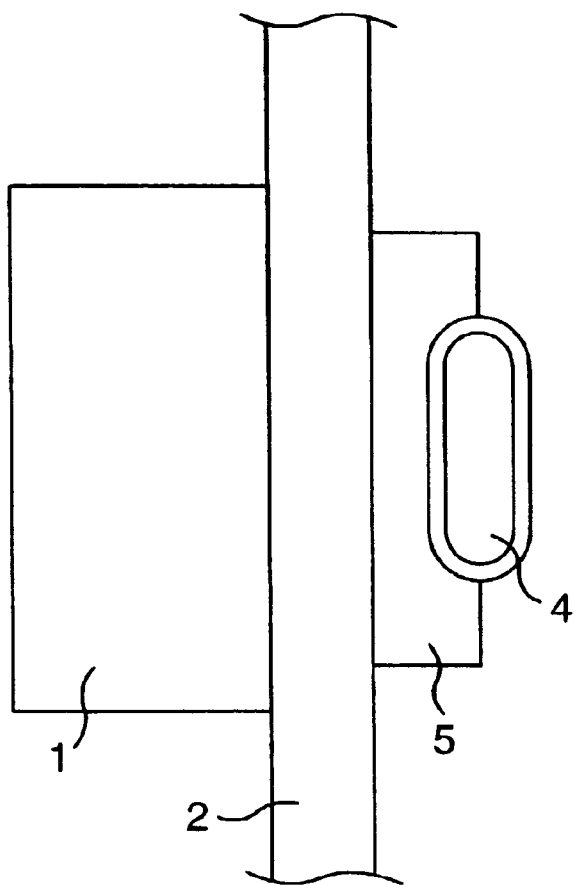

COOLING APPARATUS FOR ELECTRONIC UNIT

BACKGROUND OF THE INVENTION

The present invention relates to a cooling apparatus for electronic systems, and in particular to a cooling apparatus which utilizes liquid coolant so as to cool, one by one, electronic parts such as semiconductor devices, a CPU, an FET and a power amplifier, which are used in an electronic circuit within an electronic system.

RELATED ART

Several circuit boards are densely installed in a housing rack of an electronic system such as an electronic computer or a broad casting system, and they are mounted thereon with electronic parts including semiconductor devices, a CPU, a FET and a power amplifier, which generate high heat power Accordingly, a cooling apparatus is required for cooling the electronic system. Electronic parts generating high temperature heat, such as electronic devices, a CPU and a power amplifier, are effectively operated in a narrow temperature range, and accordingly, they have to be individually cooled, instead of cooling the electronic system in its entirety. Accordingly, in a cooling apparatus for an electronic system, these years, electronic parts are located, adjacent to a cooling pipe through which liquid coolant flows in order to cool them.

For example, JP-U-2-28965, JP-A-63-131469 and JP-A-6-304739, propose such a configuration that a flattened cooling pipe which meanders is attached to a water-cooled cooling plate on which electronic parts are mounted so as to increase the thermal contact area between the cooling plate and the cooling pipe in order to enhance the cooling efficiency. With this configuration, in order to efficiently transfer heat generated from the electronic part to the flattened cooling pipe, the oblateness of the flattened cooling pipe is increased so as to increase the thermal transfer cross-sectional area between the electronic part and the flatted cooling pipe. For example, the width of the flattened cooling pipe is widened up to a value which is equal to or greater than the width of the electronic part. However, if several electronic parts are arrayed, the flattened cooling pipe should successively be bent so as to meander along the electronic parts which are densely mounted on a circuit board, and accordingly, the radii of curvature with which the flattened cooling pipe is bent must be smaller. In general, bending a flattened pipe having a high oblateness to a small radius of curvature is extremely difficult in comparison with bending a flattened pipe having a small oblateness in view of the manufacture thereof. Further, if has been found, the higher the obateness, the larger the pressure loss of the flattened cooling pipe.

Meanwhile, if the oblateness of the flattened cooling pipe is restrained to be small, the radius of curvature of the flattened cooling pipe would be decreased. However, the heat transfer cross-sectional area (thermal contact area) between the electronic part and the flattened cooling pipe becomes smaller, thereby enhancement of the cooling capacity for the electronic part is restricted.

Thus, successively bending the flattened cooling pipe having a high oblateness so as to cope with an array of electronic parts which are densely mounted causes restriction to any of enhancement of cooling efficiency, enhancement of the productivity of the flattened cooling pipe and reduction of pressure loss in the flattened cooling pipe.

Further, the cooling apparatus for an electronic system, dewing is likely to occur around a cooling pipe through which liquid coolant flows, and an electronic part to be cooled in view of a relationship between a temperature and a humidity of an environment surrounding them. This dewing would cause inferior insulation, deterioration of the electronic part, inferior contact of a connector and the like. Further, in a cold season, when the temperature of the environment around the electronic system, such as, the atmospheric temperature is lowered, liquid coolant which carries out heat-exchange with the environment through the intermediary of a heat-exchanger is frozen, causing fracturing of the cooling pipe, or lowering of the performance of the electronic part. That is, it is required to control the temperature of the electronic part with the use of a cooling apparatus in order to efficiently operate the electronic part within a relatively narrow effective operating temperature range.

JP-A-6-164178 proposes a cooling apparatus that detects a humidity of the environment surrounding electronic parts in an electronic system and computes a supply temperature of liquid coolant which can prevent dewing so as to control this supply temperature.

JP-A-5-75284 proposes a cooling apparatus which carries out heat-exchange between coolant and an atmosphere in an electronic system when the difference between a temperature of the coolant and a temperature of the atmosphere in the electronic system becomes equal to a predetermined value during deenergization of the electronic parts, in order to prevent dewing during a start of operation of the electronic system.

JP-B2-2656581 discloses a cooling apparatus that measures an atmospheric temperature in an electronic system and a temperature of liquid coolant, and detects dewing around a cooling pipe in the cooling apparatus by means of a dew sensor in order to surely prevent dewing around the cooling pipe.

Further, JP-B2-2508640 discloses a cooling apparatus which controls turn-on and -off operation of a plurality of heat-exchanger units having different cooling capacities in accordance with a difference between a supply side temperature and a return side temperature of liquid coolant, and a difference between an atmospheric temperature in an electronic system and the supply side temperature of the liquid coolant in order to carry out efficient cooling.

As stated above, in the cooling apparatus using liquid coolant, the capacity of the heat-exchanger unit is set so as to obtain a temperature range in which electronic parts including semiconductor devices, an FET, a CPU and a power amplifier efficiently function. Since the heat-exchanger unit introduces the atmospheric air and carries out heat-exchange between the atmospheric air and liquid coolant so as to cool the liquid coolant, the liquid coolant is excessively cooled as the temperature of the atmospheric air lowers, causing problems of excessive consumption of power, freezing and dewing.

Further, in an unmanned broadcasting system, a plurality of parallel electronic systems are in general provided in order to enhance the reliability, one of which is used as a living system for usual operation while the other of which is used as a stand-by system that is adapted to operate if the living system malfunctions. Further, in an electronic apparatus, a plurality of electronic systems are operated, independent from one other, and accordingly, there may be such a case that one of the electronic system is operated but the other rests. In this apparatus, the electronic systems are incorporated with cooling apparatuses, respectively, and if one of the electronic system rests, the corresponding cooling apparatus also rests. Accordingly, in the electronic system on resting, since liquid coolant stagnates, it is required to prevent the liquid coolant from being frozen when the temperature of ambient air lowers. Thus, anti-freezing fluid is in general used as liquid coolant. This anti-freezing fluid causes possible corrosion of a part of the cooling pipe or that of a tank with which the anti-freezing fluid makes contact. Further, handling of the anti-freezing fluid requires consideration fully to the environment. Further, should the liquid coolant having a low temperature pass through the electronic system which has a high temperature, and which is started from a rest condition, there would be caused a problem of dewing as mentioned above. Thus, it is required to maintain the temperature of the liquid coolant at a temperature higher than the dewing temperature. Thus, it is desirable to always heat liquid coolant in the system on resting by means of a heater or the like or to operate all electronic systems at the same time. Thus, relatively large power consumption is required to avoid lowering the temperature of the liquid coolant below the dewing temperature.

JP-A-9-298377 discloses a cooling apparatus having a plurality of heat-exchanger units which are provided in a plurality of housings accommodating therein electronic circuits, wherein an atmosphere is led from a first housing into a heat-exchanger unit belonging to a second housing through a duct so as to cool the atmosphere in this heat-exchanger unit in order to cool electronic circuits in the second housing, thereby to reduce the volume of blowing air in total.

Further, heaters are provided respectively in tanks in a plurality of cooling systems, which are intermittently energized in order to warm up liquid coolant for an electronic system on resting, that is, for a stand-by electronic system, and pumps in the cooling systems are intermittently operated in order to prevent occurrence of freezing and dewing.

However, such intermittent operation of the pumps and intermittent operation of the heaters in the tanks within the cooling systems would cause problems of deterioration of the function of the pumps, increase of the consumption power and the like.

SUMMARY OF THE INVENTION

The present invention is devised in order to eliminate the above-mentioned problems to inherent to the above-mentioned prior art, and accordingly, a first object of the present invention is to provide a cooling apparatus for an electronic system, in which a cooling pipe having a high oblateness is laid along positions corresponding to several electronic parts densely mounted in an electronic system, having curved parts each formed of a circular pipe with a small radius of curvature, thereby aim at enhancing the cooling function for several electronic parts, reducing pressure loss and enhancing the productivity of the cooling pipe.

Further, a second object of the present invention is to provide a cooling apparatus for an electronic system, which controls the heat-exchange capacity of a heat-exchanger unit in accordance with an ambient temperature so as to stably maintain an operating temperature of the electronic parts, irrespective of an ambient temperature, and to aim at saving energy while the effective operating temperature is maintained.

Further, a third object of the present invention is to provide a cooling apparatus for a plurality of electronic systems, which can enhance the reliability of the cooling apparatus itself and aim at saving energy.

A fourth object of the present invention is to provide a cooling apparatus for a plurality of electronic systems, in which liquid coolant in a cooling system on operation (a living system) is led into a stand-by cooling system (a back-up system) on resting so as to allow the temperature of liquid coolant in the stand-by cooling system (back-up system) on resting to approach that of the liquid coolant in the cooling system on operation in order to aim at preventing occurrence of freezing and dewing, to allow a stand-by electronic system to smoothly start its operation, thereby it is possible to aim at saving energy.

According to a first aspect of the present invention, there is provided a cooling apparatus including a cooling pipe for feeding liquid coolant direct below or around a heat generating element and a heat-exchanger unit for expelling heat from the liquid coolant which has absorbed heat from the heat generating element, and externally emitting the heat, the liquid coolant having a low temperature being repeatedly circulated through the cooling pipe, wherein the cooling pipe is flattened in part so as to form flattened parts which are located right below the heat generating elements in the vicinity of the same in order to increase a planar projection area of the heat generating element, thereby the generated heat is efficiently transmitted to the liquid coolant.

Further, the cross-sectional area of the flattened parts of the cooling pipe is set to be smaller than that of parts other than the former so as to increase the velocity of the liquid coolant in order to enhance the cooling efficiency.

Further, the flattened parts of the cooling pipe are integrally incorporated with parts other than the former, thereby it is possible to prevent leakage of the liquid coolant.

Further, the cooling pipe is flattened only in required parts so as to restrain pressure loss.

Further, each of the flattened parts of the cooling pipe is fixed to one surface of a substrate having the other surface, opposite to the former, which is attached thereto with the heat generating element, through the intermediary of a heat conduction block, and accordingly, the cooling pipe can be attached on one surface side of the substrate.

According to the first aspect of the present invention, with the use of the above-mentioned measures, since the part of the cooling pipe attached in the vicinity of the heat generating element, is formed into a flattened shape, the planar contact surface area with respect to the heat generating element can be increased while the heat flux can smoothly enter the cooling pipe, normal to the latter, thereby it is possible to efficiently transmit heat to the liquid coolant.

Further, the part of the cooling pipe attached to the heat generating element is formed into a flattened shape, the velocity of the fluid is increased so as to enhance the heat transmission rate, thereby it is possible to enhance the thermal efficiency of the cooling pipe.

Further, the cooling pipe is formed from its inlet to its outlet from a single pipe, and is formed into flattened shapes only in parts in the vicinity of heat generating elements, and accordingly, the pressure loss can be restrained to be minimum, thereby it is possible to miniaturize a pump for feeding liquid coolant and to minimize power consumption.

Further, the cooling pipe is formed from its inlet to its outlet, from a single pipe, and accordingly, no joints are present therein, thereby it is possible to substantially eliminate leakage of liquid coolant, and to aim at enhancing the quality and reliability of the cooling apparatus.

Further, the part where the cooling pipe is formed into a flattened shape, is jointed thereto with a heat conduction block having a satisfactory heat transmission, with the use of a brazing material or the like, and accordingly, the cooling pipe can be fixed to a circuit board on the side remote from the electronic part as the heat generating element attached thereto. Thus, the cooling pipe can be attached with no affection upon the electronic parts mounted on the circuit board, thereby it is possible to enhance the workability of assembly of the electronic system. That is, since the circuit board on which the electronic parts are mounted, is isolated from the cooling pipe, thermal deformation caused during assembly of the cooling pipe can be prevented from being transmitted to the circuit-board side.

According to a second aspect of the present invention, there is provided a cooling apparatus comprising a heat-exchanger unit for expelling heat which has been absorbed from heat generating elements in an electronic system by cooling the heat generating elements, a pump for circulating liquid coolant for cooling the heat generating elements, a tank for reserving the liquid coolant, cooling pipes through which the liquid coolant flows, and around which the heat generating elements are mounted, and pipe line elements for connecting the cooling pipe and the like, the liquid coolant being fed and circulated, the heat-exchange capacity of the heat-exchanger unit is controlled in accordance with an atmospheric temperature.

Further, the range where the operating temperature of the electronic parts which generates heat in the electronic system varies, depending upon variation in the atmospheric temperature, is made to be narrower, and accordingly, the stability and the reliability of operation of the electronic parts can be enhanced. If the temperature variation range in the electronic system is as narrow as possible, the necessity of anti-freezing fluid can be eliminated, and as a result, the pipe line including the cooling pipe through which the liquid coolant is circulated can be prevented from being deteriorated due to corrosion or the like, thereby it is possible to further enhance the reliability.

Further, the heat-exchange capacity is controlled in accordance with an atmospheric temperature detected by a temperature detector provided in an inlet port for introducing the atmospheric air while whether at least either one of a temperature of liquid coolant detected by a temperature detector provided in the electronic system and a temperature of an electronic part serving as the heat generating element, detected by a temperature detector provided to the electronic part is within a safe operation range or not is confirmed. Further, the rotational speed of a motor for driving a fan for introducing the atmospheric air into the heat-exchanger unit, or the turn-on and -off rate of an input power source may be controlled in order to control the heat-exchange capacity of the heat-exchanger unit. Further, the heat-exchange capacity can be controlled at four stages, that is, the heat-exchange capacity is relatively high, middle, low and extremely low due to the operation of the fan for heat-exchange is stopped, in accordance with an atmospheric temperature.

A third aspect of the present invention is to provide a cooling apparatus comprising two cooling systems each including a heat-exchanger unit which expels heat absorbed from an electronic system through the intermediary of a cooling pipe, a pump for circulating liquid coolant for cooing the electronic system, a tank for reserving the liquid coolant, pipe line elements for connecting the former, and a damper for taking a part of the expelled heat into a fan duct of the heat-exchanger unit, the electronic system being cooled through the intermediary of the cooling pipe, one of the two cooling system being normally operated and the other one of them being stand-by.

Further, it has a temperature measuring means and a control means for controlling the heat-exchanger unit in response to a signal from the temperature measuring means.

That is, according to the third aspect of the present invention, the cooling apparatus does not expel all heat absorbed by the heat-exchanger unit during operation, but a part of the heat is selectively taken into the fan duct through an opening opened by the damper so as to raise the temperature in the housing of the electronic system, thereby it is possible to prevent occurrence of dewing in the electronic system and freezing of the liquid coolant.

According to a fourth aspect of the present invention, there is provided a highly efficient liquid cooling apparatus comprising two liquid cooling systems each including a heat-exchanger unit for expelling heat absorbed from heat generating elements in an electronic system during cooling of the heat generating elements, a pump for circulating liquid coolant for cooling the heat generating element, a tank reserving the liquid coolant, a cooling pipe through which the coolant flow and in the vicinity of which the heat generating elements are mounted, and pipe line elements for connecting the former, wherein the tank is commonly used for both liquid cooling systems.

Further, according to the fourth aspect of the present invention, the commonly used tank may be provided therein with a partition panel for holding in the tank the liquid coolant so as to feed the liquid coolant into the two liquid cooling systems, independent from each other. The partition panel in the tank partitions the lower part of the inside of the tank into two spaces which are isolated from each other in the lower part of the tank, but which are opened to each other in the upper part of the tank. Thus, the liquid coolant in the tank flows freely in the upper part of the tank, thereby it is possible to feed the liquid coolant above the upper edge of the partition panel into either of the two cooling systems.

Further, according to the fourth aspect of the present invention, an inlet pipe line to the tank has a port provided at a position which is relatively near to the partition panel, at a height which is slightly lower than the upper edge of the partition panel while an outlet pipe line from the tank has a port provided at a position which is relatively far from the partition panel, and which is in the bottom part of the tank. With this arrangement, the liquid coolant above the upper edge of the partition wall can flow into either of the two liquid cooling systems, efficiently due to the kinetic energy of the liquid coolant flowing through the ports of the pipe lines.

According to the fourth aspect of the present invention, in the case of such an operation mode that the heat generating element in the first one of the two liquid cooling systems do not generate heat but while those in the second one of the them generate heat, the first cooling system allows the liquid coolant to continuously flows therethrough while the first cooling system allows the liquid coolant to intermittently flow therethrough or stop the flow of the liquid coolant, thereby it is possible to prevent occurrence of dewing or freezing. Further, in the case of the circulation of the liquid coolant, the operation of the cooling fan of the heat-exchanger unit in the second system may be rested.

Further, in the liquid cooling apparatus according to the fourth aspect of the present invention, in the case of the circulation of the liquid coolant for expelling heat absorbed from the heat generating element in the electronic system during cooling of the heat generating elements, the operation of the cooling fan of the heat-exchanger unit in the second cooling system may be rested.

Explanation will be hereinbelow made of preferred embodiments of the present invention with reference to the accompanying drawings.

BRIEF DESCRIPTION OF THE ACCOMPANYING DRAWINGS

FIG. 3 is a sectional view along line A—A in FIG. 1;

FIG. 4 is a view for explaining, in detail, the cooling structure according to the present invention;

DETAILED DESCRIPTION OF PREFERRED EMBODIMENTS

Figure 1:
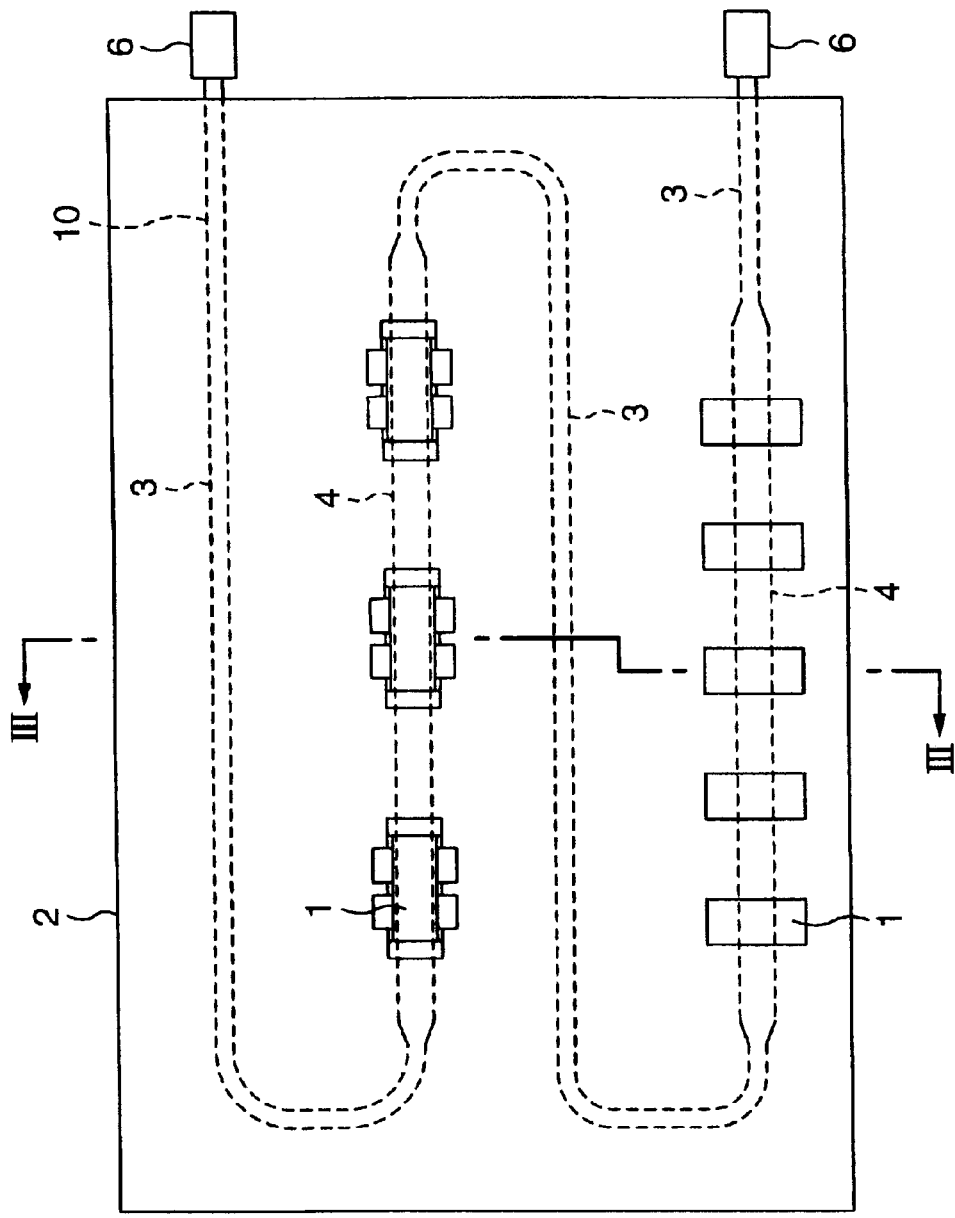
FIG. 1 is a plan view illustrating a cooling structure in one embodiment of the present invention.
Figure 2:
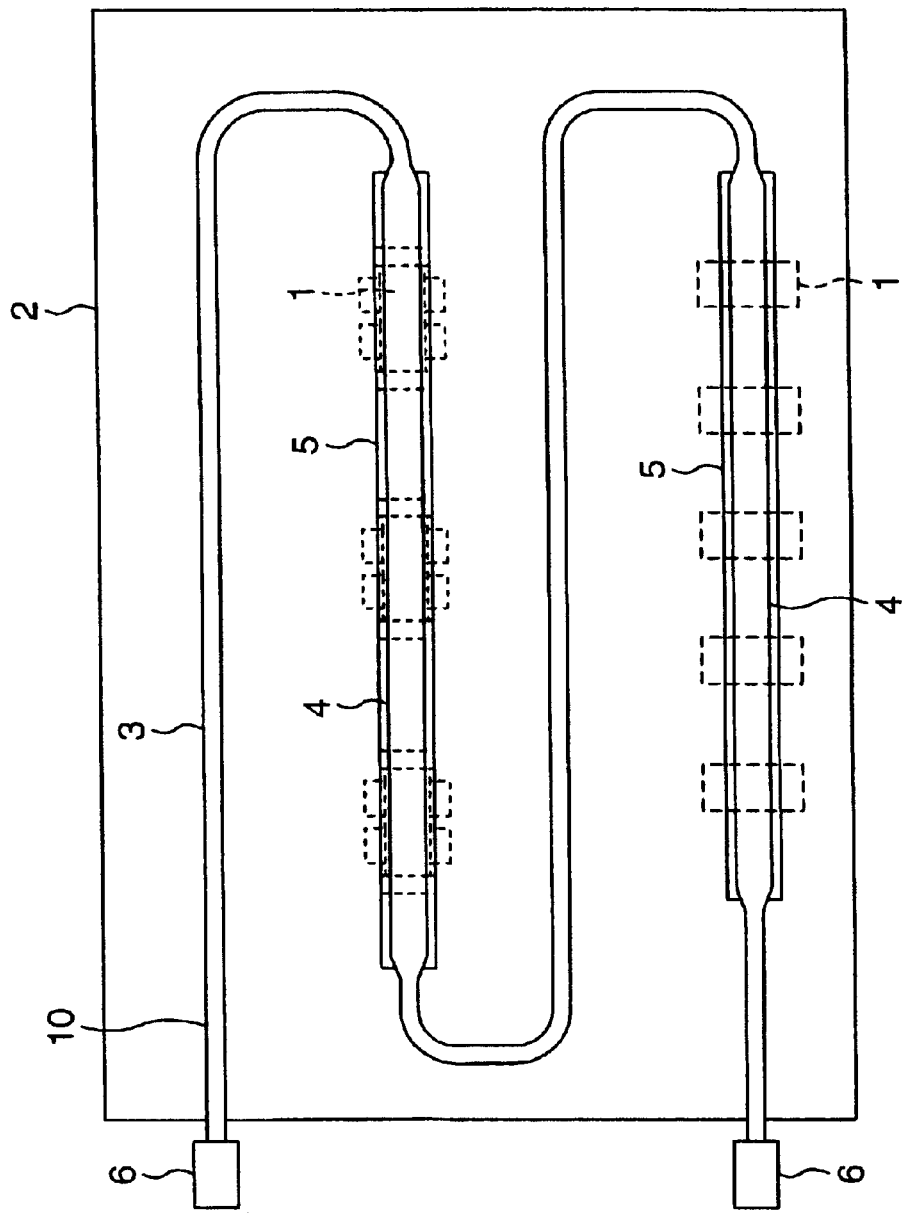
FIG. 2 is a plan view illustrating the cooling structure shown in FIG. 1, as viewed on another side.
Figure 5:
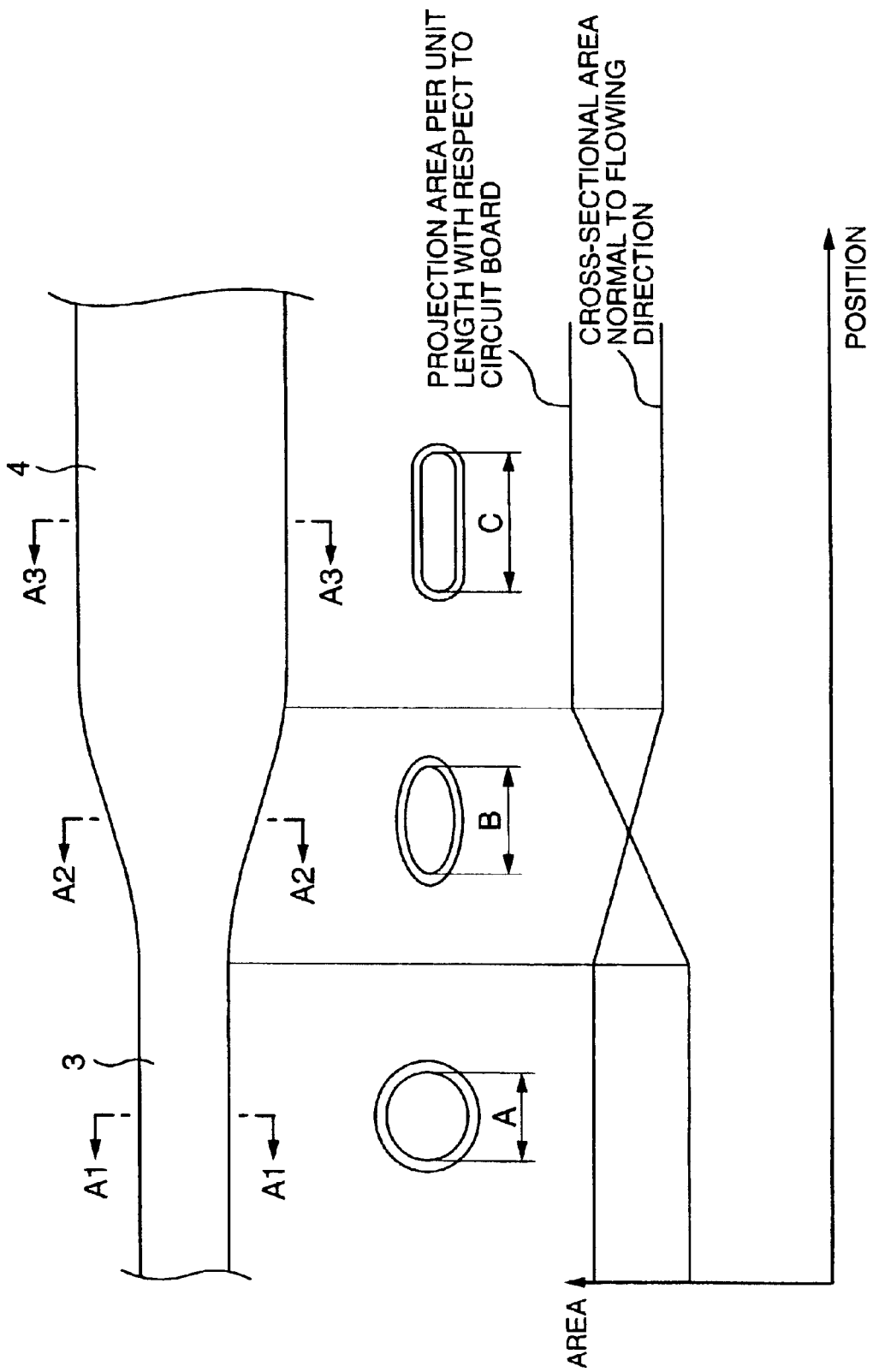
FIG. 5 is a view for explaining the relationship among several parts of a cooling pipe in the cooling structure according to the present invention.

FIG. 1 is a plane view which shows a cooling apparatus in a first embodiment of the present invention, FIG. 2 is a plane view which shows the cooling apparatus shown in FIG. 1 as viewed on another side, and FIG. 3 is a sectional view along line A—A in FIG. 1, FIG. 4 is a view for explaining, in detail, the configuration of the cooling apparatus shown in FIG. 1, and FIG. 5 is a view for explaining several parts of a cooling pipe in the cooling apparatus shown in FIG. 1.

Referring to FIGS. 1 to 3, heat generated from heat generating elements 1 mounted on a circuit board 2 transmits through the circuit board 2 and heat conduction blocks 5 and then to flattened part 4 of a cooling pipe 10, and is then absorbed and carried away from the circuit board 2 by liquid coolant flowing through the cooling pipe 10 so as to cool the heat generating elements 1. It is noted here that the liquid coolant flows from the outside of the circuit board 2 into the cooling pipe 10 through a connection plug 6 at one end thereof, and flows from a connection plug at the other end thereof, outside of the circuit board 2.

This cooling pipe 10 has flattened parts 4 having flattened cross-sectional shapes and circular parts 3 having a circular cross-sectional shape, and as shown in FIG. 4, the flattened parts 4 of the cooling pipe 10 are arranged right below and in the vicinity of the heat generating elements. In particular, in the case of cooling several heat-generating elements 1, a plurality of the heat generating elements 1 are linearly lined up, and the flattened parts 4 are also linearly lined up so as to make distances between the heat generating parts 1 and the flattened parts 4 equal to one another. Meanwhile, the cooling pipe 10 has the circular parts 3 located between the connection plugs 6 and the flattened parts 4 and between the flattened parts 4.

Explanation will be hereinbelow made of the flattened parts 4 and the circular parts 4 of the cooling pipes in comparison, with reference to FIG. 5. Referring to this figure which is an outlook view as viewed in the flattening direction of the flattened parts 4 of the cooling pipe 10 and as viewed in the axial direction of the pipe 10, the cross-sectional shape of the cooling pipe 10 is gradually changed from the circular part 3 to the flattened part 4, as view cross-sections along line A1—A1, A2—A2 and A3—A3. That is, as shown in FIG. 5, as to the shape in cross-section normal to the flowing direction of the liquid coolant, the circular part 3 has a circular cross-sectional shape with a cross-sectional area A, and a part between the circular part 3 and the flattened part 4 has an elliptic cross-sectional shape with a cross-sectional B while the flattened part 4 has a flattened cross-sectional shape with a cross-sectional area r C, defined by two planar parts which are laid substantially parallel with each other.

The relationship among the cross-sectional areas in this embodiment is exhibited as follows:

Area A<Area B<Area C and accordingly, the projection area with respect to the surface of the circuit board 2 becomes broadest per unit length in the flattened part 4. Further, the cross-sectional area normal to the flowing direction is broadest in the circular part 3, but is smaller in the flattened part 4 than in the circular part 3.

Accordingly, since the projection area of the flattened part 4 is broader than that of the circular part 3 while the thermal heat flux from the heat generating part 1 comes to the flattened part 4, normal thereto, heat can be efficiently transmitted to the liquid coolant.

Figure 16:
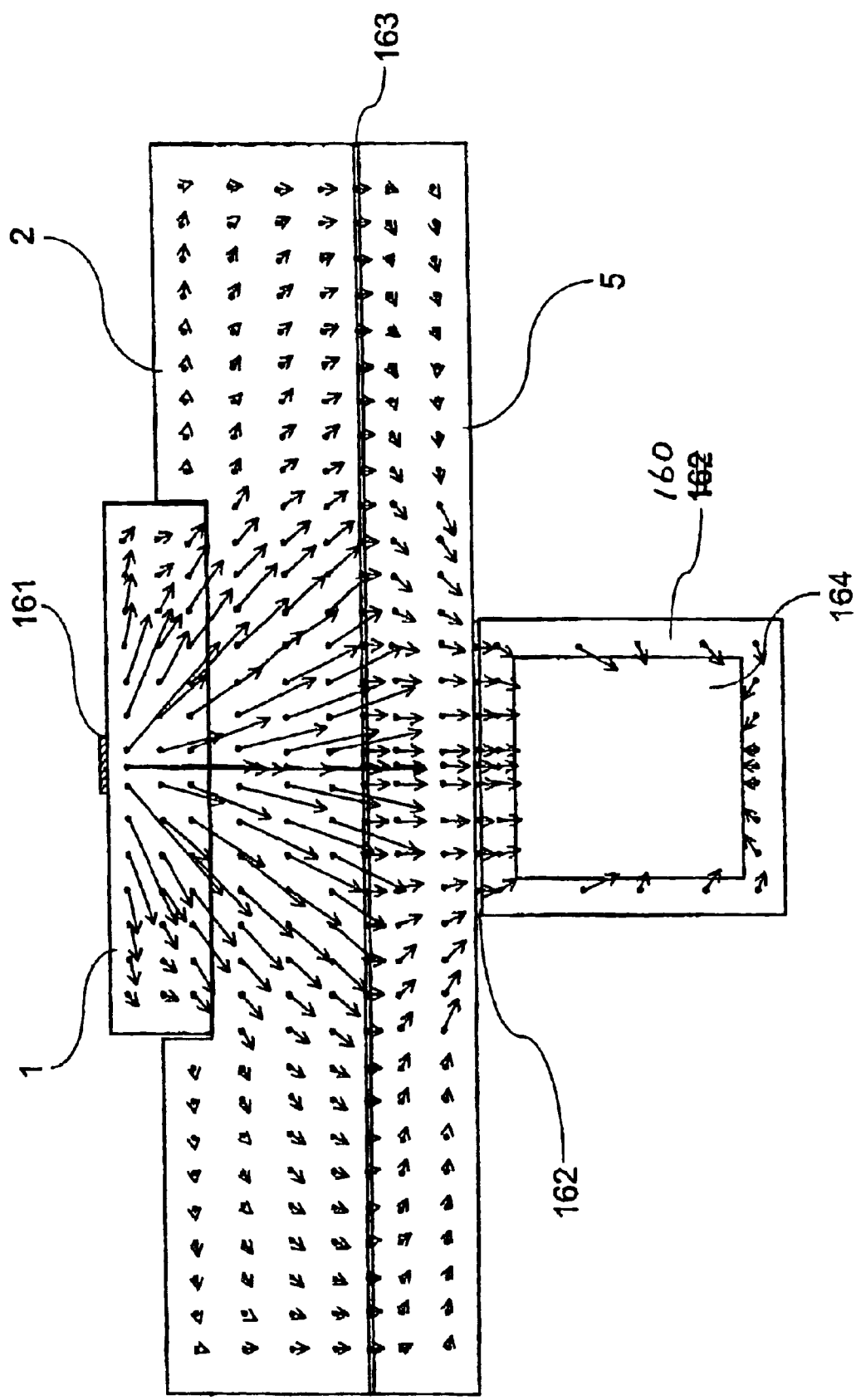
FIG. 16 is a view for explaining the cooling structure according to the present invention in detail.

FIG. 16 is a view which shows a thermal heat flux distribution in a zone extending from a heat generating element to cooling water in such a case that a cooling pipe 16 having a square cross-section is brazed to a flat (planar) heat conduction block 5. In the configuration shown in FIG.

16, the heat generated from the heat-generating element 161 among the heat generating elements 1 (electronic parts) in the structure shown in the cross-sectional view of FIG. 4 transmits through the circuit board 2 and the heat conduction block 5 and to the cooling pipe having a circular (cylindrical) cooling pipe. It is noted that the cooling pipe 162 should have a circular cross-sectional shape (although it is shown in FIG. 16 having a square cross-sectional shape by modeling). It is noted that square marks exhibits positions wherein the thermal heat flux is calculated, and arrows extended therefrom indicate directions of thermal transfer, the lengths of the arrows degrees of the thermal heat flux. It is noted that the square marks shown in FIGS. 17 and 18 are very small so as to be vague since the number of analysis points is increased.

Figure 17:
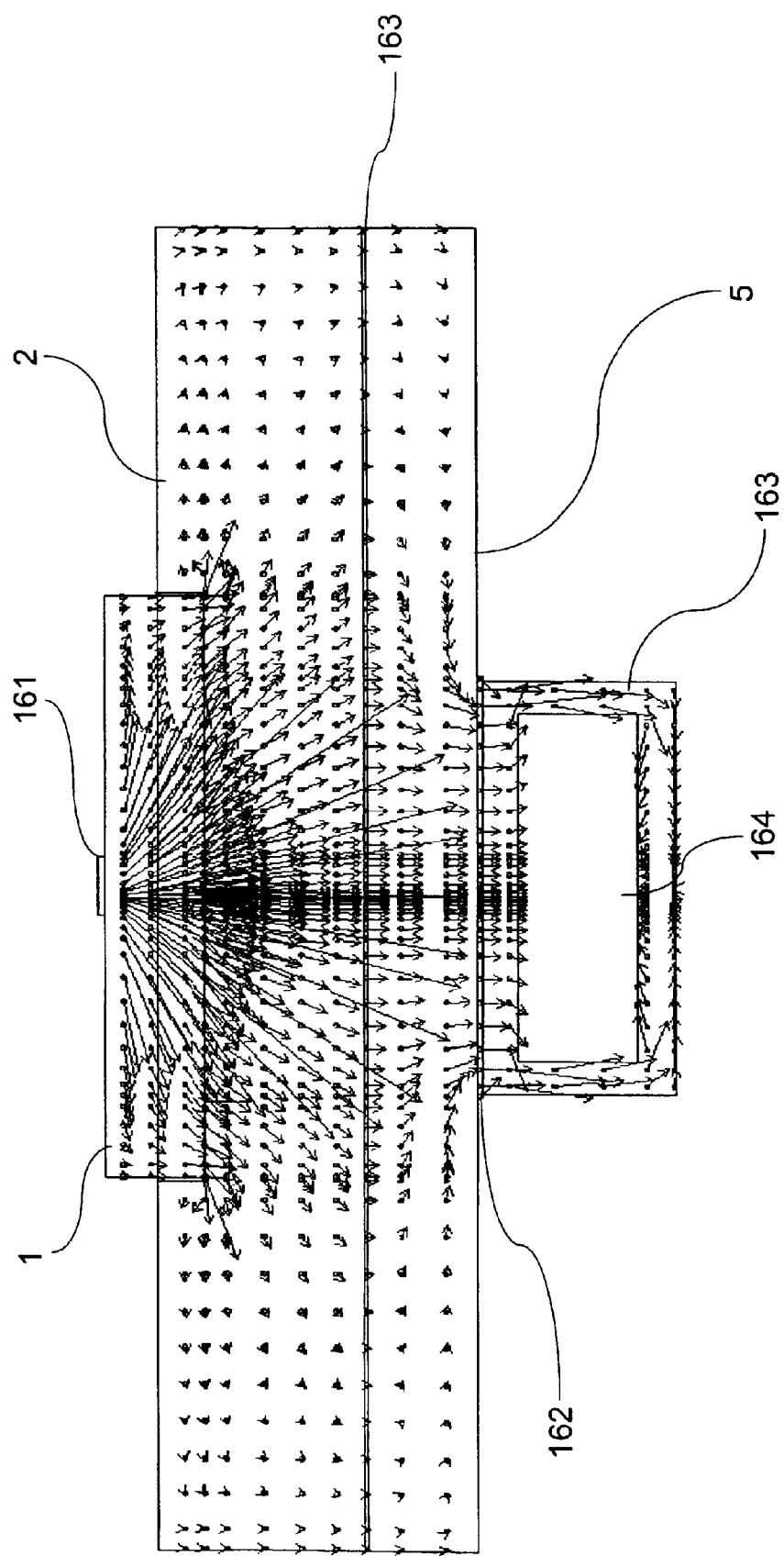
FIG. 17 is a view for explaining the cooling structure according to the present invention in detail.
Figure 18:
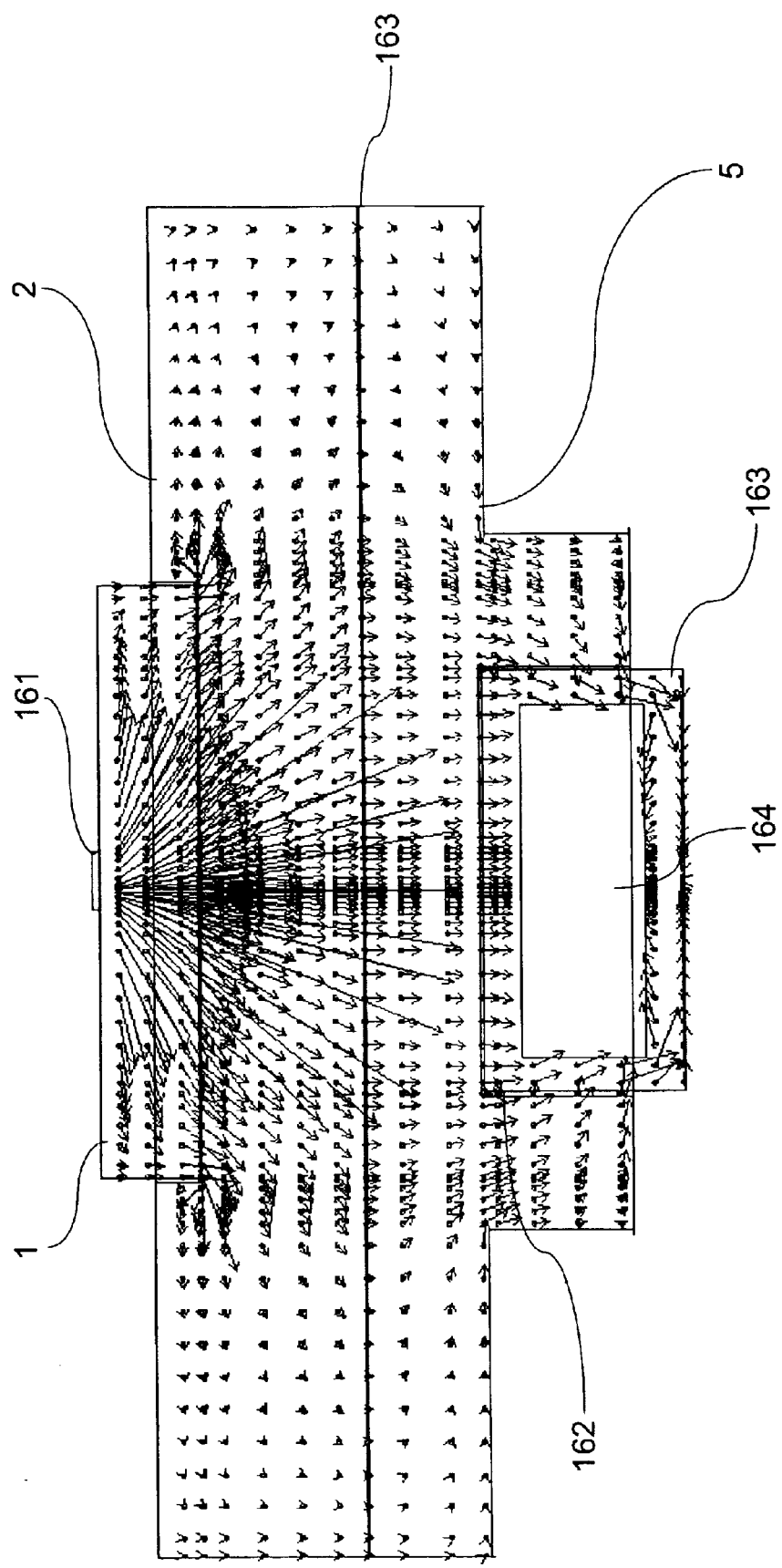
FIG. 18 is a view for explaining the cooling structure according to the present invention in detail.

FIG. 17 shows a result of simulation of thermal heat flux in the structure in the embodiment of the present invention shown in the cross-sectional view of FIG. 4.

The simulation is made in such a way that a heat generating element generating a heat power of 88W was attached to an aluminum circuit board (for example, an aluminum based copper clad laminated circuit board having a thickness of 6 mm) to which planar copper heat conduction block 5 was fixed by screws through the intermediary of heat-conductive grease, and a copper flattened cooling pipe 163 was attached to the block 5. In this simulation, the flattened cooling pipe 163 was press-formed from a copper pipe having a bore diameter of 9.5 mm in to a flattened shape having an inner size of 3 mm, which was modeled as an equivalent rectangular pipe. Cooling water is fed so as to flow through the flattened pipe 163 at a flow rate 50 l/mm.

From FIG. 17, it is understandable that a strong thermal heat flux generated from the heat generating element 161 is broadly distributed in the circuit board 2, and smoothly flows into the flattened cooling pipe through the intermediary of the heat conduction block 5.

FIG. 18 shows a structure of the heat conduction block 5 attached to the flattened pipe 163, having a recessed shape in a condition substantially similar to that shown in FIG. 16. It is understandable that the thermal heat flux flows into the flattened pipe 163, more smoothly than that shown in FIG. 17.

Further, since the cross-sectional area of the flattened part 4 is smaller than that of the circular part 3, and accordingly, the heat transmission performance between the wall of the cooling pipe and the liquid coolant can be enhanced only by increasing the flow velocity of the liquid coolant.

Further, the cross-sectional area of the flattened part 4 is smaller than that of the circular part 3, and accordingly, the flow velocity of the liquid coolant is increased in the flattened part 4, thereby it is possible to enhance the performance of heat transmission between the wall of the cooling pipe and the liquid coolant.

It is noted that several parts of the cooling pipe 10 in the circuit board 2 are, in general, inevitably formed in U-like shapes, and accordingly, the circular parts 3 are used for the curved parts thereof, that is, only parts of the cooling pipe 10 in the vicinity of the heat generating parts have flattened cross-sectional shapes but parts thereof other than the former have circuit cross-sectional shapes, thereby it is possible to restrain pressure loss to a minimum value.

Further, the possible bending radius of a pipe having a circular cross-sectional shape is smaller than that of a pipe having a flattened cross-sectional shape, and the workability thereof is satisfactory. Accordingly, in comparison with the use of the pipe having a flattened cross-sectional shape, electronic parts can be densely arrayed, thereby it is possible to obtain a large design margin for patterning electronic parts.

The cooling pipe 10 as stated above, can be formed from a unitary pipe with no joint therein from one end to the other end thereof. That is, a cooling pipe having flattened parts therein may be easily manufactured from a pipe made of metal or the like and having a circular cross-sectional shape. Thus, it is simply made to form a part of a circular cross-sectional shape pipe into a flattened cross-sectional shape pipe part. With the integral formation of the cooling pipe, occurrence of leakage from the cooling pipe 10 in the circuit board 2 can be eliminated as possible as it can. Further, in view of the integral formation with no joint, occurrence of pressure loss which would be inevitably caused by any joint can be eliminated.

Further, the heat conduction block 5 and the cooling pipe 10 can be attached to a surface of the circuit board 2, other than the surface onto which the heat generating element 1 is attached, and accordingly, a work for providing the cooling structure according to the present invention can be carried out efficiently with no affection upon the mounting of the heat generating elements 1.

That is, when the cooling pipe 10 is soldered or silver-brazed direct to the circuit board 2 (which is, for example, a high power metal circuit board such as a laminated board having an aluminum base with copper coating), it is attached with high temperature heat, and accordingly, it would cause thermal deformation of the circuit board 2. With the use of the heat conduction block 5, no heat is transmitted to the circuit board 2 during attachment of the pipe having flattened parts, thereby it is possible to prevent thermal deformation of the circuit board 2. Since the curved parts of the cooing pipe have a circular cross-sectional shape, and accordingly, step differences would be caused when it is attached to the circuit board 2. However, by removing the heat conduction block 5 from the curved part, or by changing the thickness of the heat conduction block 5, the height difference can be absorbed. The connection between the circuit board 2 and the heat conduction block 5 to which the cooling pipe 10 is attached, can be made by means of screws with the use of, for example, thermally conductive compound.

Further, as shown in FIG. 18, a part of the heat conduction block 5 where the cooling pipe 10 is attached, is formed in a recess-like shape so as to increase, for example, a wettable area for silver-brazing, thereby it is possible to further enhance the performance of heat transmission from the heat conduction block 5 to the cooling pipe 10. Further, the assembly thereof is facilitated while the strength of the connection can be increased, thereby it is possible to enhance the reliability.

Figure 6:
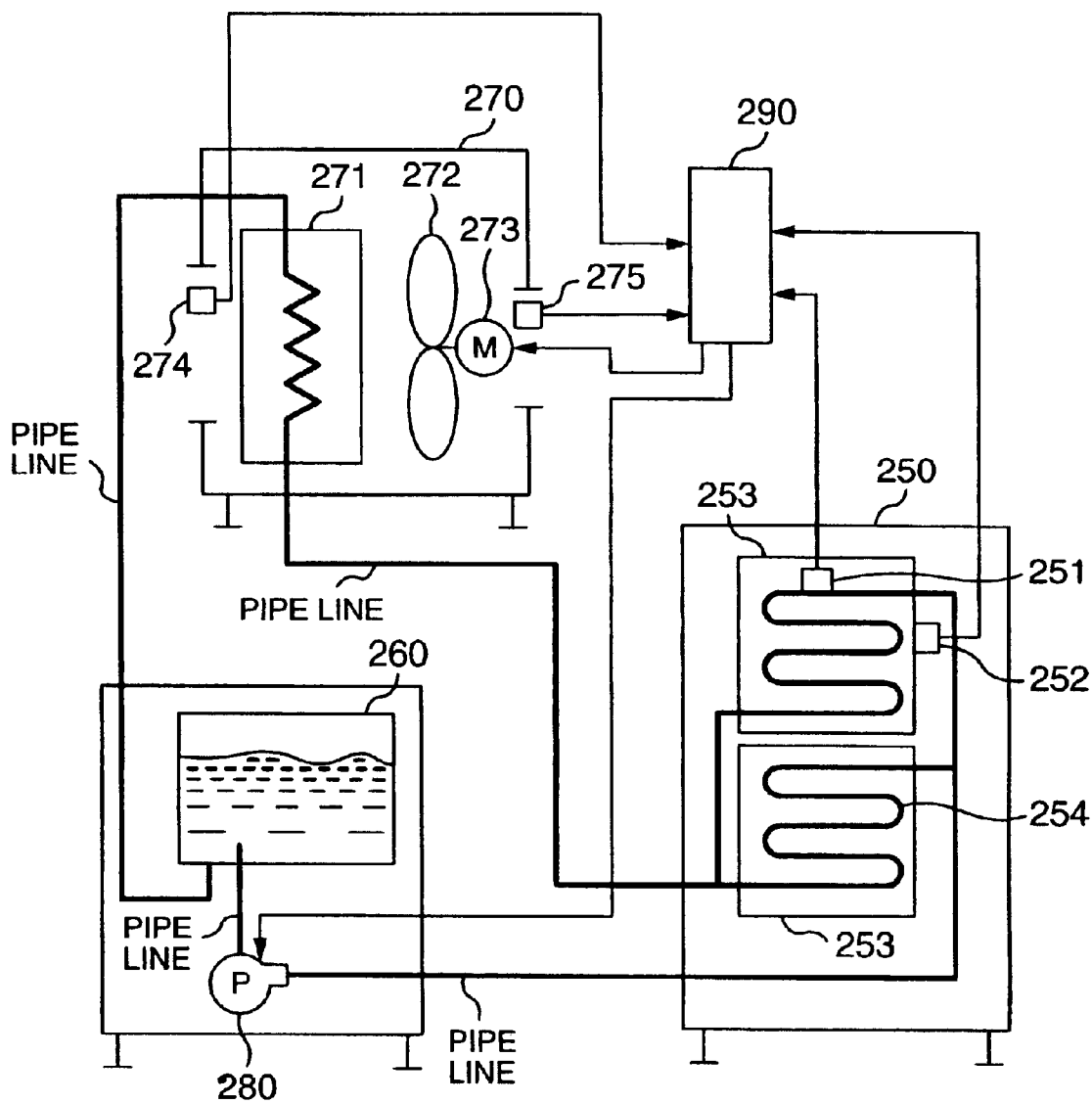
FIG. 6 is a view for illustrating a configuration of a liquid coolant cooling apparatus in a second embodiment of the present invention.

Explanation will be hereinbelow made of a second embodiment of the present invention. In a cooling apparatus in the second embodiment, as shown in FIG. 6, liquid coolant is fed and circulated through a cooling pipe laid in an electronic system 250 including heat generating elements so as to expel heat from the electronic system 250. A cooling pipe is laid in the vicinity of FETs serving as heat generating elements and mounted on circuit boards 253, and liquid coolant is fed through the cooling pipe for absorbing heat from the FETs. A temperature detector 251 is provided, making contact with the cooling pipe in the circuit board 253 so as to detect a temperature of the liquid coolant flowing through the cooling pipe. A temperature detector 252 is provided making contact with an FET which is not shown and which is mounted on the circuit board so as to detect a temperature of the FET. A heat-exchanger unit 270 for cooling the liquid coolant whose temperature has been raised is composed of a heat-exchanger 271, a cooling fan 272, and a motor 273 for rotating the cooling fan 273. There are provided temperature detectors 274, 275 either one of which detects a temperature of ambient air on the ambient air introduction port side of the heat-exchanger unit 270, a tank 260 and a pump 280. Further, a pipe line consists of cooling pipes for circulating the liquid coolant from the circuit board 253 to the heat-exchanger unit 270, from the heat-exchanger unit 270 to the tank 260, from the tank 260 to the pump 280, and from the pump 280 to the circuit board 253. A controller 290 receives temperatures detected respectively by the temperature detectors 251, 252, 274, 275, and controls the operation of the motor 273 and the pump 280.

According to the present invention, the capacity of the heat-exchanger unit 270 is controlled in accordance with a temperature of the ambient air detected by either one of the temperature detectors 274, 275, that is, the rotational speed of the cooling fan is controlled. In other words, the control of operation and stop (control for turn-on and -off operation) of the motor is carried out.

Figure 7:
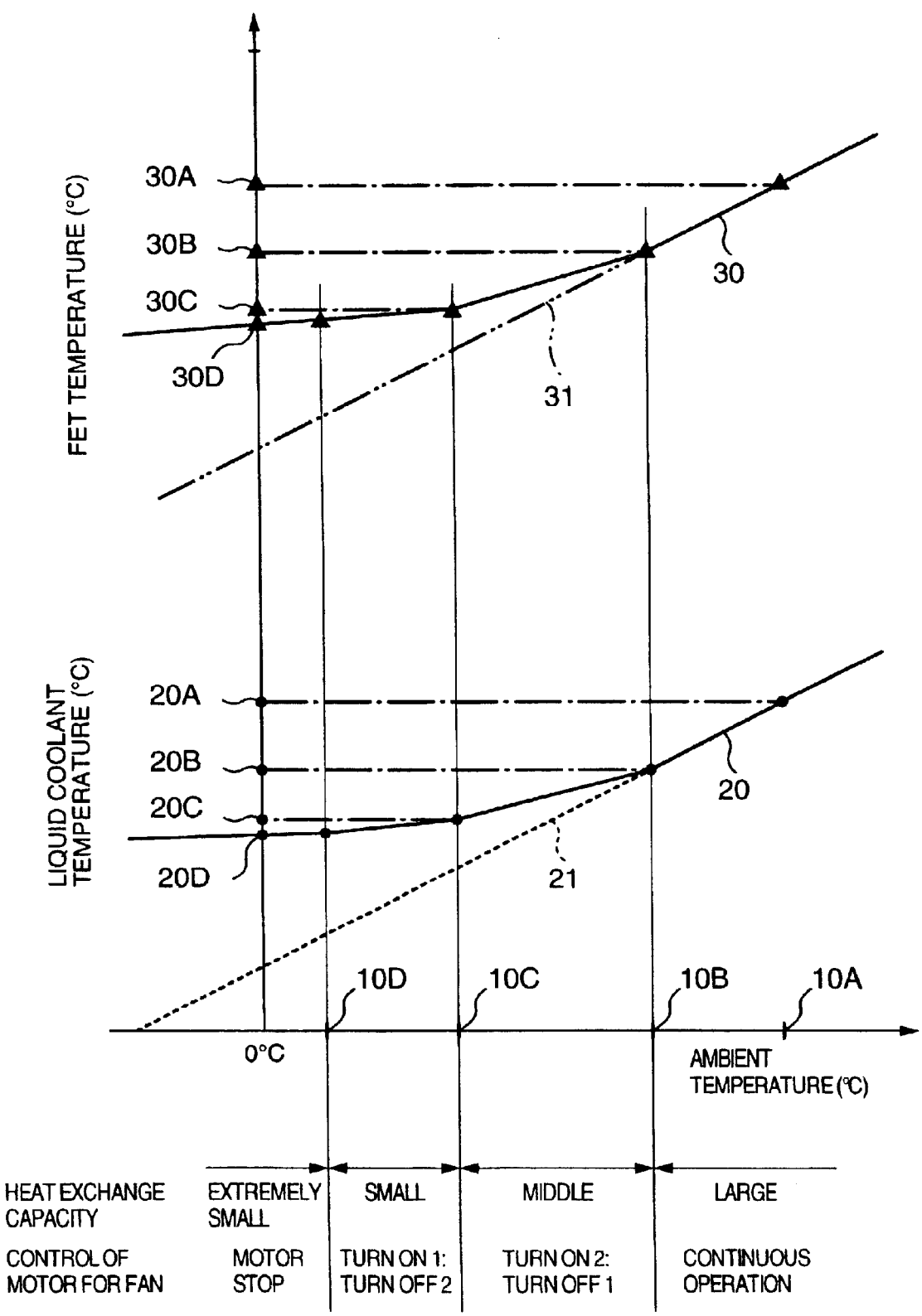
FIG. 7 is a graph for explaining an example of operation of the apparatus shown in FIG. 6.

Specifically, If the temperature of ambient air varies so as to become not higher than a temperature 10B, as shown in FIG. 7, accordingly, if the temperature of the FET is not higher than 30B as shown in FIG. 7, the turn-on and -off rate of operation of the motor 273 is controlled by the controller 290 or the motor 273 is stopped. Thereby, it is possible to obtain the operation of the fan with energy saving in comparison with such a case that the motor is continuously operated.

Explanation will be hereinbelow made of the operation of this embodiment wit reference to FIGS. 7 and 8. Referring to FIG. 7, there are shown threshold values of 10A to 10D of the temperature of the ambient air at which the control operation is changed over. The solid line 20 is a characteristic of the temperature of the liquid coolant with respect to the temperature of the ambient air in the circuit board 253 in the electronic system 250. The dotted line 21 is a characteristic of the liquid coolant with respect to the temperature of the ambient air in such a case that the cooling fan 272 is continuously operated, that is, the temperature of the liquid coolant is changed in proportion to variation in the temperature of the ambient air. It is noted here that temperatures 20A to 20D of the liquid coolant correspond respectively to the threshold values 10A to 10D of the temperatures of the ambient air.

Referring to FIG. 7, the polygonal solid line 30 is a characteristic of the temperature of the FET on the circuit board 253 in the electronic system 250 with respect to the temperature of the ambient air. The dotted polygonal line 31 is a characteristic of the temperature of the FET with respect to the temperature of the ambient air in such a case that the cooling fan 272 is continuously operated, that is, it is exhibited that the temperature of the FET is changed in proportion to a variation in the temperature of the ambient air. It is noted that temperatures 30A to 30D of the FET correspond respectively to the threshold values 10A to 10D of the temperature of the ambient air.

Next, explanation will be made of the turn-on and -off control of the motor 273 for the cooling fan 272 in order to control the capacity of the heat-exchanger 271 in relation to the temperature of the ambient air, the heat-exchange capacity and the temperature of the liquid coolant.

Figure 8:
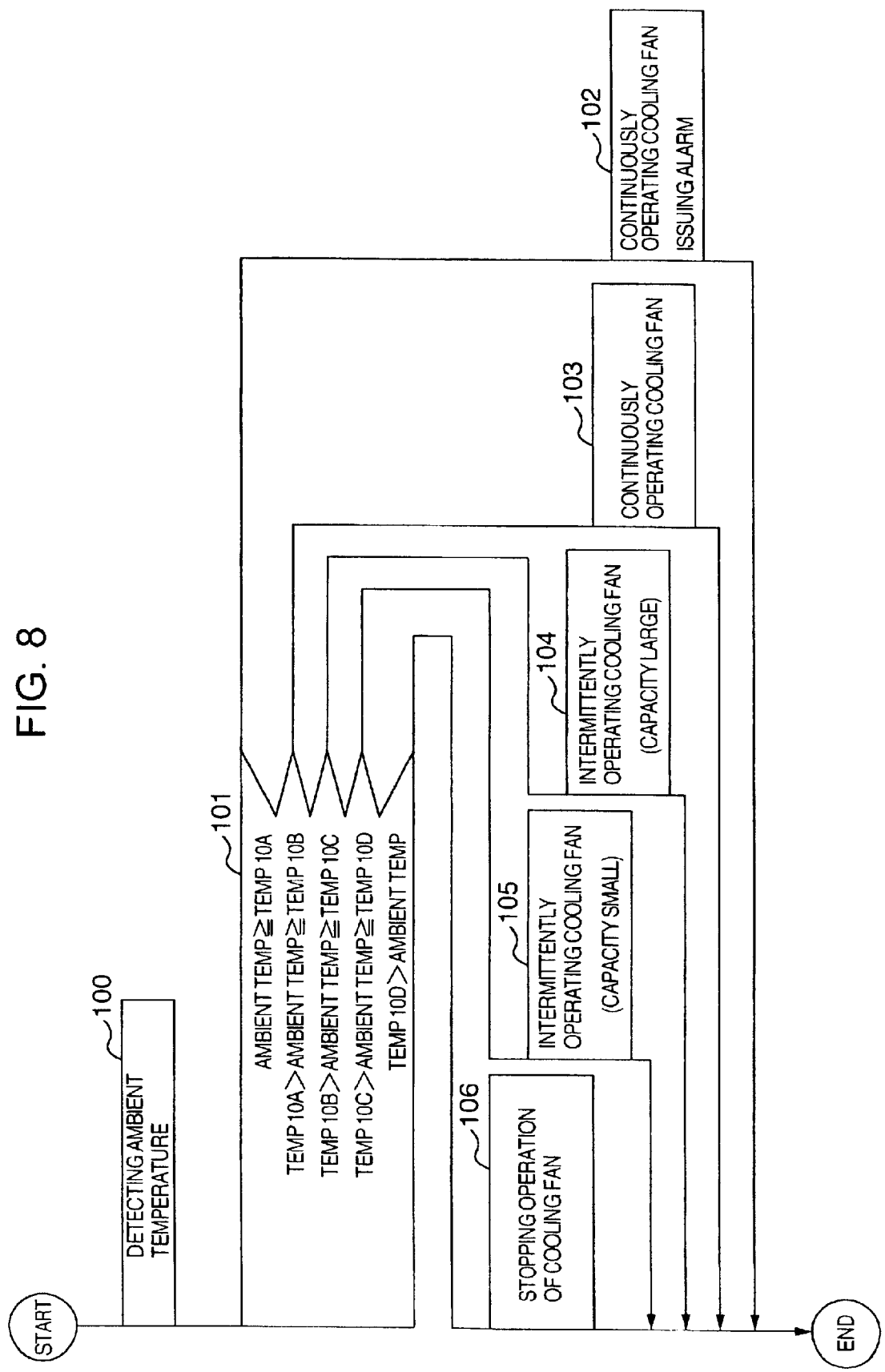
FIG. 8 is a flow-chart for explaining an example of operation of the apparatus shown in FIG. 6.

If the detected temperature is not lower than 10B (if either of first and second terms in the descending order at step 101 shown in FIG. 8 is satisfied), the controller 290 controls the motor 273 so as to continuously operate the cooling fan 272, and as a result, the heat-exchange capacity becomes large (steps 102 and 103). At this time, the temperature of the liquid coolant becomes not less than the temperature 20B while the temperature of the FET becomes not less than 30B. It is noted that if the temperature of the ambient air is not lower than the temperature 10A, the controller 290 may issue an alarm signal so as to warn that the temperature of the FET becomes higher, exceeding a predetermined temperature (step 102).

Further, the detected temperature of the ambient air is lower than the temperature 10B but is not lower than the temperature 10C (a third term in the descending order at step 101 is satisfied), the controller 290 controls the motor 273 so that the cooling fan 272 carries out intermittent operation through which the turn-on operation is lasted for e.g. 2 minutes and the turn-off operation is thereafter lasted for, e.g. one minute, and as a result, the heat-exchange capacity becomes relatively middle (step 104). At this time, the temperature of the liquid coolant falls in a temperature range from 20B to 20C while the temperature of the FET falls in a temperature range from 30B to 30C.

Further, If the detected temperature of the ambient air is lower than the temperature 10C but not lower than 10D (a fourth term in the descending order at step 101 is satisfied), the controller 290 controls the motor 273 so that the cooling fan 272 carries out intermittent operation through which turn-on operation is lasted for, e.g. one minute while turn-off operation is lasted for e.g. two minutes, and as a result, the heat-exchange capacity becomes relatively small (step 105). At this time, the temperature of the liquid coolant falls in a range from 20D to 20C while the temperature of the FET falls in a range from 30C to 30D.

Further, the detected temperature of the ambient air is lower than the temperature 10D (a fifth term in a descending order at step 101 is satisfied), the controller 290 controls the motor 273 so as to stop the operation of the cooling fan 272, and as a result, the heat-exchange capacity becomes relatively very small (step 106). At this time, the temperature of the liquid coolant is lower than the temperature 20D, and accordingly, the temperature of the FET is lower than the temperature 30D.

In the embodiment as stated above, the operation of the cooling fan 270 is changed over among four operation modes, that is, a continuous operation mode, an intermittent operation mode in which the rate between turn-on operation and turn-off operation is set to 2:1, an intermittent operation mode in which the rate between turn-on operation and turn-off operation is set to 1:2, and a stop operation mode.

It is noted that during a start of the cooling apparatus or the electronic system, the heat-exchange capacity is set to be relatively large, and thereafter, the operation is made with a predetermined capacity which has been determined stepwise in accordance with a temperature of the ambient air. In this arrangement, the heat-exchange capacity may be stepwise changed over.

According to the above-mentioned embodiment, the variation in the temperature of the liquid coolant can be decreased with respect to a variation in the temperature of the ambient air. Accordingly, the temperature range in which an electronic part such as an FET is operated can be narrow, thereby it is possible to stabilize the operation of the electronic part and to enhance the reliability thereof.

Figure 9:
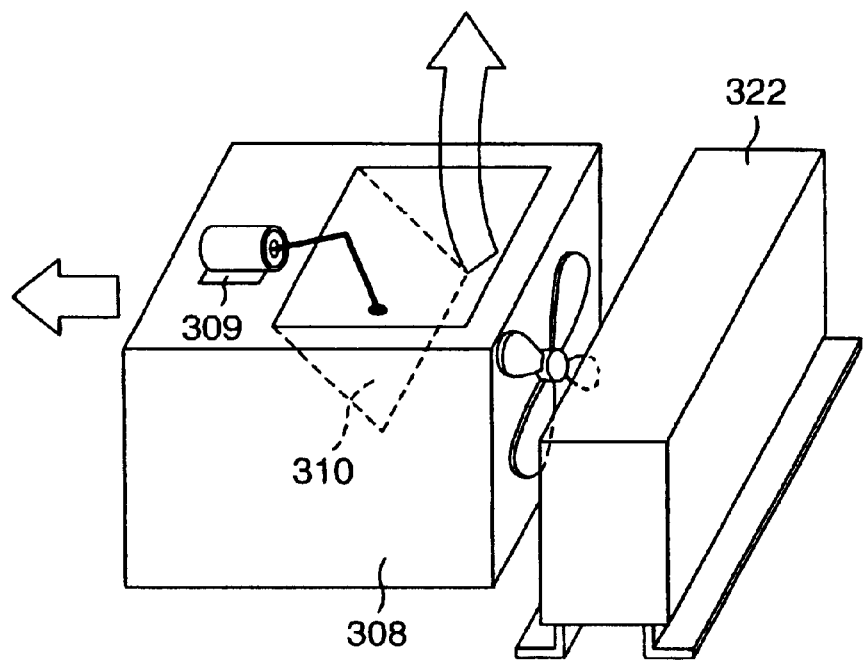
FIG. 9 is a perspective view illustrating a structure of the apparatus in a third embodiment of the present invention.
Figure 10:
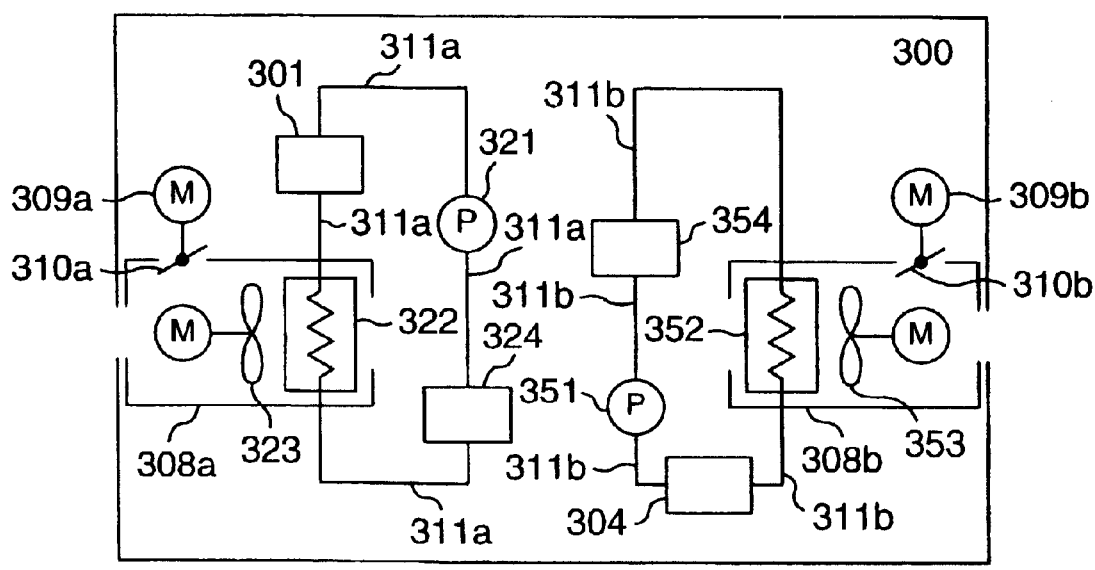
FIG. 10 is a view illustrating a configuration of the apparatus in the third embodiment.

Explanation will be herein below made of a third embodiment of a cooling apparatus which aim at efficiently preventing occurrence dewing and freezing of electronic parts with reference to the drawings wherein FIG. 9 is a view which shows a structure of the third embodiment of the present invention, and FIG. 10 is a configuration of the cooling apparatus for carrying out the third embodiment of the present invention.

Referring to FIG. 9, there are shown a duct 308, a damper 310 provided in the wall surface of the duct 308, a motor 309 for controlling the opening and closing of the damper 310. In this figure, it is understood that a part of air heated by heat-exchangers 322, 352, is recirculated into the cooling apparatus through the opening of the damper 310.

Referring to FIG. 10 which shows a configuration of the cooling device for electronic systems, including two cooling systems, there are shown electronic systems 301, 304 having heat generating elements, pumps 321, 351 for circulating liquid coolant, heat-exchangers 322, 352 in heat-exchanger units and tanks 324, 354 for reserving therein the liquid coolant, the above-mentioned components are connected with one another through pipe lines (cooling pipes) 311 so as to circulate the liquid coolant therethrough. Thus, heat generated from the heat generating elements in the electronic systems 301, 304 is absorbed by the liquid coolant flowing through the cooling pipes laid adjacent to the heat generating elements, and after the temperature of the liquid coolant is lowered through the heat-exchangers 322, 352, the liquid coolant is recirculated through the electronic systems by way of the tanks 322, 352. The heat-exchangers 322, 352 are incorporated together with cooling fans 323, 353 in the ducts 308 each incorporated in the damper 310 and the motor 309 so as to constitute heat-exchanger units. Thus, by blowing air from the cooling fans 323, 353, air which has been warmed up by heat from the liquid coolant through the intermediary of the heat-exchangers 322, 352 is expelled into the outside, as is similar to the conventional configuration.

The essential feature of this embodiment is as follows: referring to FIG. 10, a temperature A of liquid coolant in the tank 324 on the operation side which is on operation in the cooling apparatus, and a temperature B of the liquid coolant in the tank 354 on the stand-by side are detected. Then, a temperature difference C between the temperatures A and B is obtained (C=A−B). Thus, heat generated from the electronic system 301 on operation at the temperature A is expelled from the heat-exchanger 322 in the heat-exchanger unit 308a on the basis of the temperature difference C. Thus, at least a part of the warmed-up air is returned to the cooling apparatus 300 through the opening of the damper 310 which has been opened. Thus, the temperature in the cooling apparatus is raised by the returned and warmed-up air. Further, when the temperature in the cooling apparatus is raised, the temperature B also increases, and in this case, the temperature difference C becomes smaller, thereby it is possible to prevent dewing and freezing in the electronic system 304 on the stand-by side.

In order to detect the temperature difference C, for example, the temperature A and the temperature B are measured by temperature sensors, respectively, and a value obtained by the subtraction therebetween, is set as the temperature difference C. Further, in a method of extracting a part of the heat expelled by the heat-exchanger unit, as shown in FIG. 10, with the provision of the motor 309 and the damper 310 which are attached to the duct 308 in the heat-exchanger unit, the opening and closing of the damper 310 are controlled by using the motor 309 in accordance with the temperature difference C or the temperature B so as to enable such a control that a part of the heat expelled from the heat-exchanger unit, is extracted into the cooling apparatus, or is not extracted thereinto.

Next, explanation will be made of the operation of the cooling apparatus in this embodiment having the above-mentioned configuration. At first, the temperature A and the temperature B are measured, and the temperature difference C (C=A−B) is calculated. Then, if either the temperature difference C is the one from which occurrence of dewing is expected or the temperature B is the one from which occurrence of freezing is expected, the damper 310 of the duct 308 in the heat-exchanger unit on the operation side is opened by the motor 309 so as to recirculate a part of expelled heat into the cooling apparatus in order to increase the temperature A. Further, the temperature B is increased to a value around the temperature A or a temperature with which the liquid coolant is prevented from being frozen. Thereby it is possible to prevent occurrence of dewing or freezing in the electronic system on the stand-by side.

The above-mentioned temperature difference C can be obtained, for example, through subtraction from the temperatures A and B which are detected respectively by temperature sensors. Further, in the method of taking up a part of heat expelled by the heat-exchanger unit, as shown in FIG. 10, the opening and closing of a damper 310a or a 310b attached to a duct 308a or 308b are controlled by a motor 309a or 309b in accordance with the temperature difference C or the temperature B so as to take up a part of heat expelled by the heat-exchanger unit or block the same.

Figure 11:
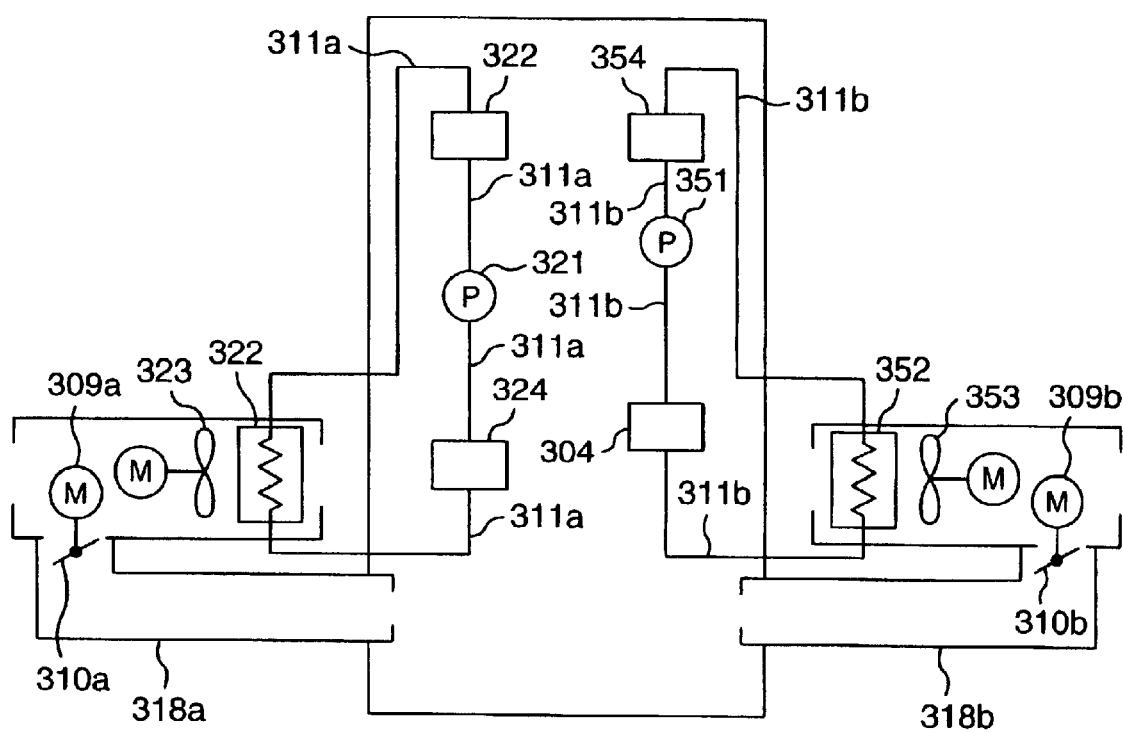
FIG. 11 is a view illustrating a structure of a fourth embodiment of the present invention.
Figure 12:
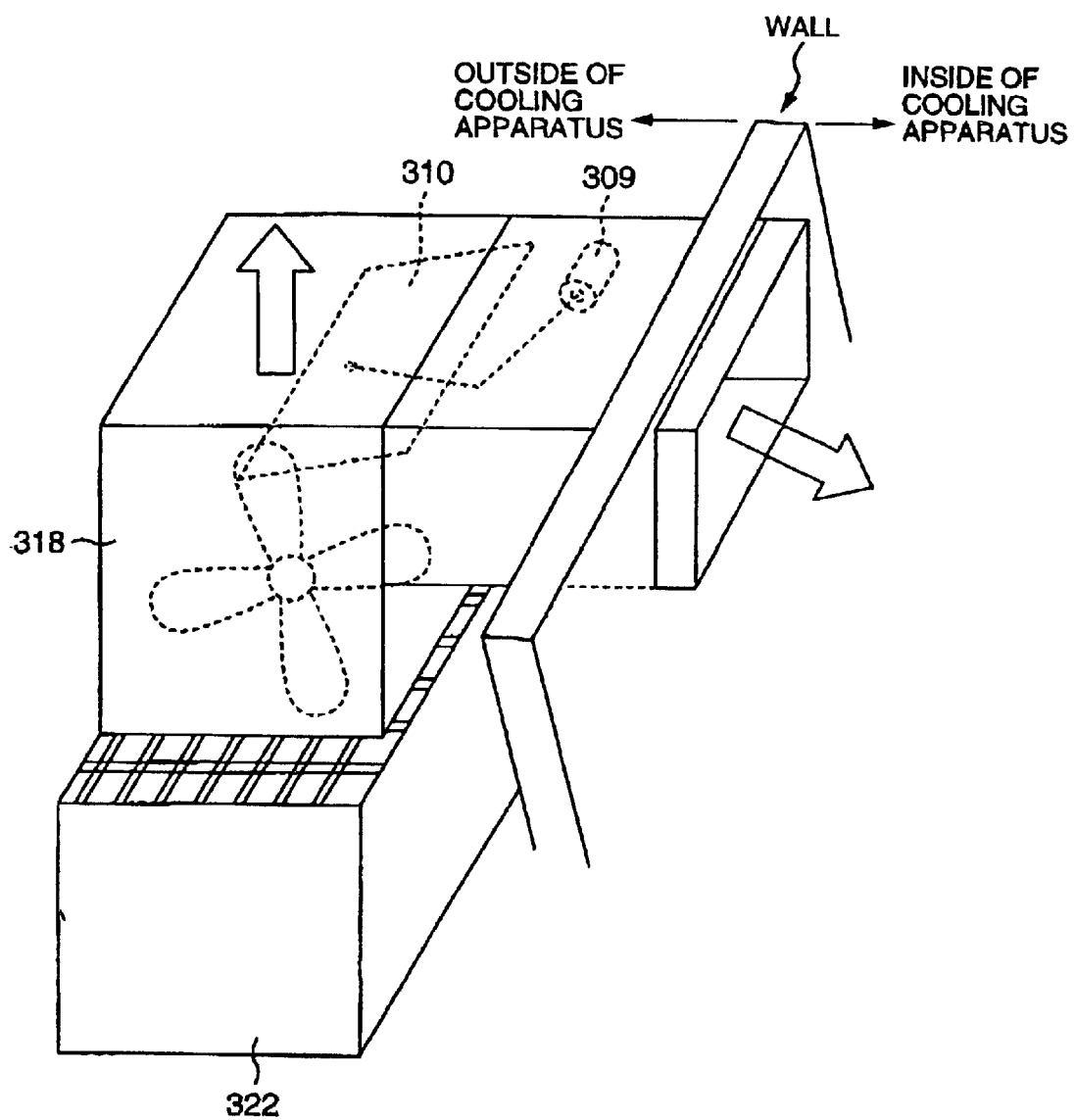
FIG. 12 is a perspective view illustrating an essential part of the fourth embodiment of the present invention.

FIG. 11 shows a configuration of a fourth embodiment of the present invention which is the same as that of the third embodiment shown in FIG. 10, except that the heat-exchanger units are not located in a housing where the tanks 324, 354 are incorporated. In this configuration, air warmed up is recirculated into the housing incorporated therein with the tanks 324, 354 by way of the duct 318a or 318b. FIG. 12 is a view which shows a configuration of an apparatus which materializes the fourth embodiment of the present invention. Referring to FIG. 12, there are shown a motor 309, a damper 310, a duct 318 and a damper 322.

As stated above, according to the third and fourth embodiments of the present invention, in the cooling apparatus for cooling an electronic or electrical system having heat-generating elements, the atmospheric temperature in the cooling apparatus or the temperature of the liquid coolant can be increased even during cooling, with a part of air warmed up by and discharged from the heat-exchanger unit in accordance with the temperature difference between the atmospheric temperature in the cooling apparatus and the temperature of the liquid coolant in the tank in the cooling system on the stand-by side, thereby it is possible to prevent occurrence of dewing or freezing in the electronic system, thereby it is possible to eliminate the necessity of intermittent operation of a heater for increasing the temperature of the liquid coolant and the pump or it is possible to restrain the frequency of the operation thereof as possible as it can. Thus, it is possible to reduce the running cost.

Figure 13:
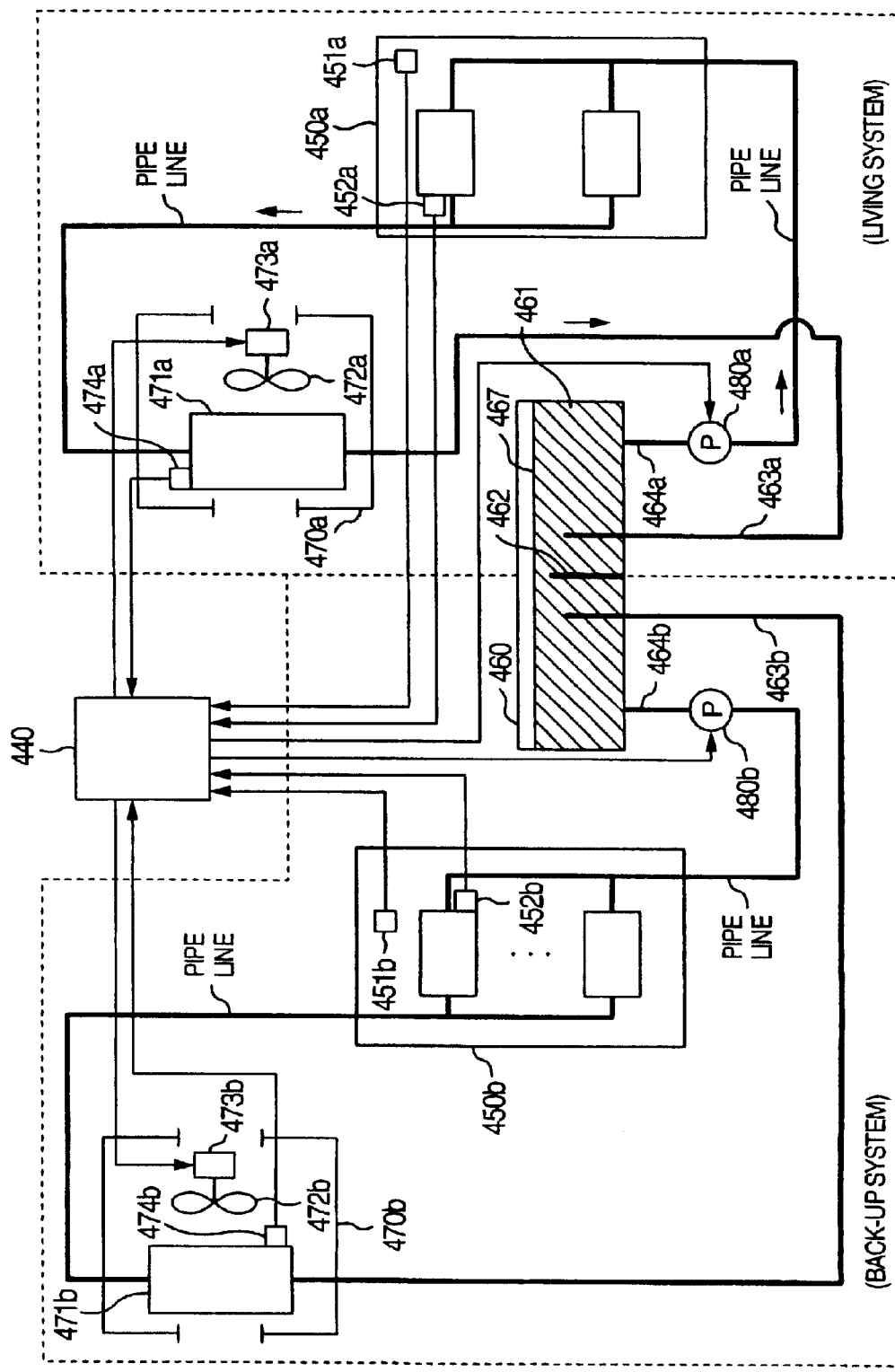
FIG. 13 is a view illustrating a configuration of a cooling apparatus in a fifth embodiment of the present invention.

Explanation will be hereinbelow made of a fifth embodiment of the present invention. FIG. 13 shows a configuration of a liquid cooling apparatus in the fifth embodiment of the present invention. As shown in the figure, each of two cooling systems, that is, a living system (a system on operation) and a backup system (a system on resting), comprises an electronic system 450a, 450b, including heat generating elements, a heat-exchanger unit 470a or 470b, and a pump 480a or 480b. But both systems commonly use a tank 460. That is, there is configured dual systems consisting of the living system and the back-up system in order to ensure the reliability. The highly efficient liquid cooling apparatus is mainly composed of these two systems, and a controller 440 for controlling these systems.

The configuration of the liquid cooling apparatus will be detailed. There are shown, in the figure, temperature detectors 451a, 451b for detecting a temperature of liquid coolant flowing through cooling pipes laid adjacent to heat generating elements in the electronic systems 450a, 450b, which deliver temperatures detected thereby to the controller 440, heat-exchangers 471a, 471b in the heat-exchanger units 470a, 470b, cooling fans 472a, 472b, motors 473a, 473b for rotating the cooling fan2 472a, 472b, and temperature detectors 474a, 474b for detecting a temperature of the liquid coolant flowing through the heat-exchangers 471a, 471b, and for delivering a temperature detected thereby to the controller 440. It is noted that the temperature detector 474a, 474b may detect temperatures of the cooling liquid flowing through predetermined pipe lines in the heat-exchanger units 470a, 470b. Further, there are shown liquid coolant 461 reserved in the tank 460, which may or may not be added therein with antifreezing fluid, a partition panel 462 for partitioning the inside of the tank 460 into a space for a living side and a space for a back-up side, inlet pipes lines 463a, 463b for introducing the liquid coolant reserved in the tank 460 and outlet pipe lines 464a, 464b for delivering the liquid coolant from the tank 460.

Figure 14:
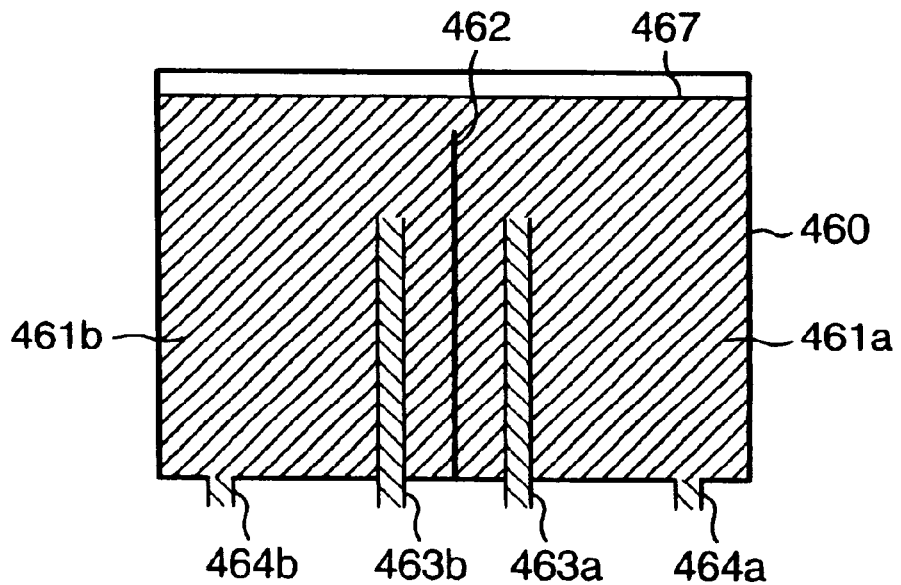
FIG. 14 is a view for explaining a relationship between liquid coolant and a position of a partition panel during normal operation.

The configuration of the tank 460 which is commonly used for two systems, which is one of the essential features of the present invention, will be explained with reference to FIGS. 14 and 15. Referring to Figure, the inside of the tank 460 is partitioned into the space for the living side and the space for the back-up side, left and right as viewed in the figure. It is noted that the partition panel 462 does not completely partition the inside of the tank 460 into the space for the living side and the space for the back-up side, but it partitions the lower part of the inside of the tank 460. That is, the upper limit end of the partition panel 462 does not reach the top of the tank 462. Thus, in the top part of the tank 460, both spaces are communicated with each other, and accordingly, the liquid coolant up to a liquid surface 467 exceeding the upper limit end of the partition panel 462 can flow into either of the two systems.

Figure 15:
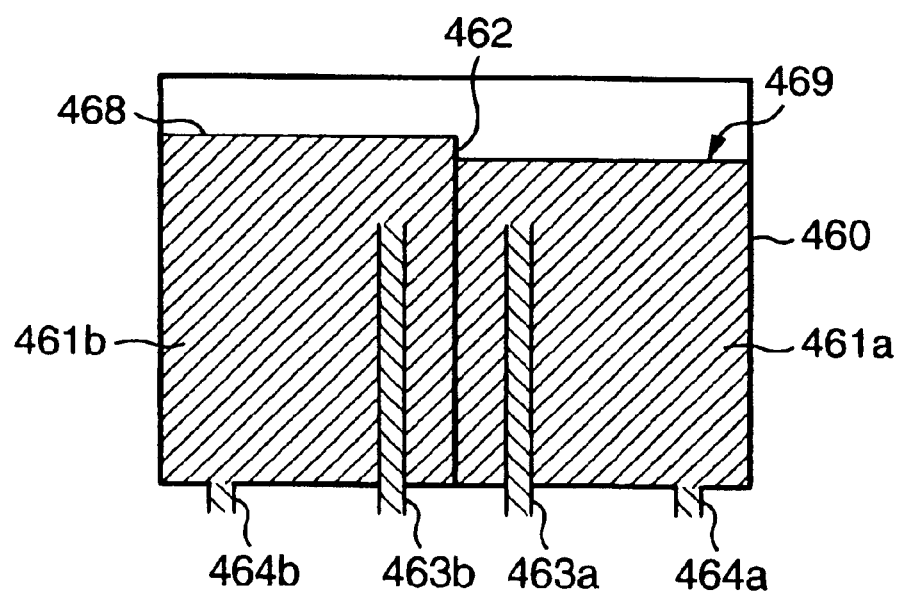
FIG. 15 is a relationship between the liquid coolant and a position of the partition panel upon occurrence of leakage of the liquid coolant.

Further, when leakage of the liquid coolant occurs, even though the quantity of the liquid coolant on one side of the partition wall 462, that is, on the living side, is continuously lowered so that the level of the liquid surface 469 is lowered, as shown in FIG. 15, the quantity of the liquid coolant on the other side of the partition panel 462, that is, the back-up side, can be continuously held as far as the quantity in the tank 460 partitioned by the partition panel 462, irrespective of the above-mentioned lowering of the liquid surface, thereby the level of the liquid coolant is held at the liquid surface 468. In this case, with the use of a means (which is not shown) for detecting the level which is lowered down to the liquid surface 469, the controller 440 carries out such a control that the living side on operation is set into an non-operating mode in accordance with a result of the detection by this means, and instead, the back-up side on resting is set into an operating mode. Thus, as viewed in the entire system which is dual systems, the operation thereof can be continued, irrespective of a deficiency such as leakage of the liquid coolant.

Figure 19:
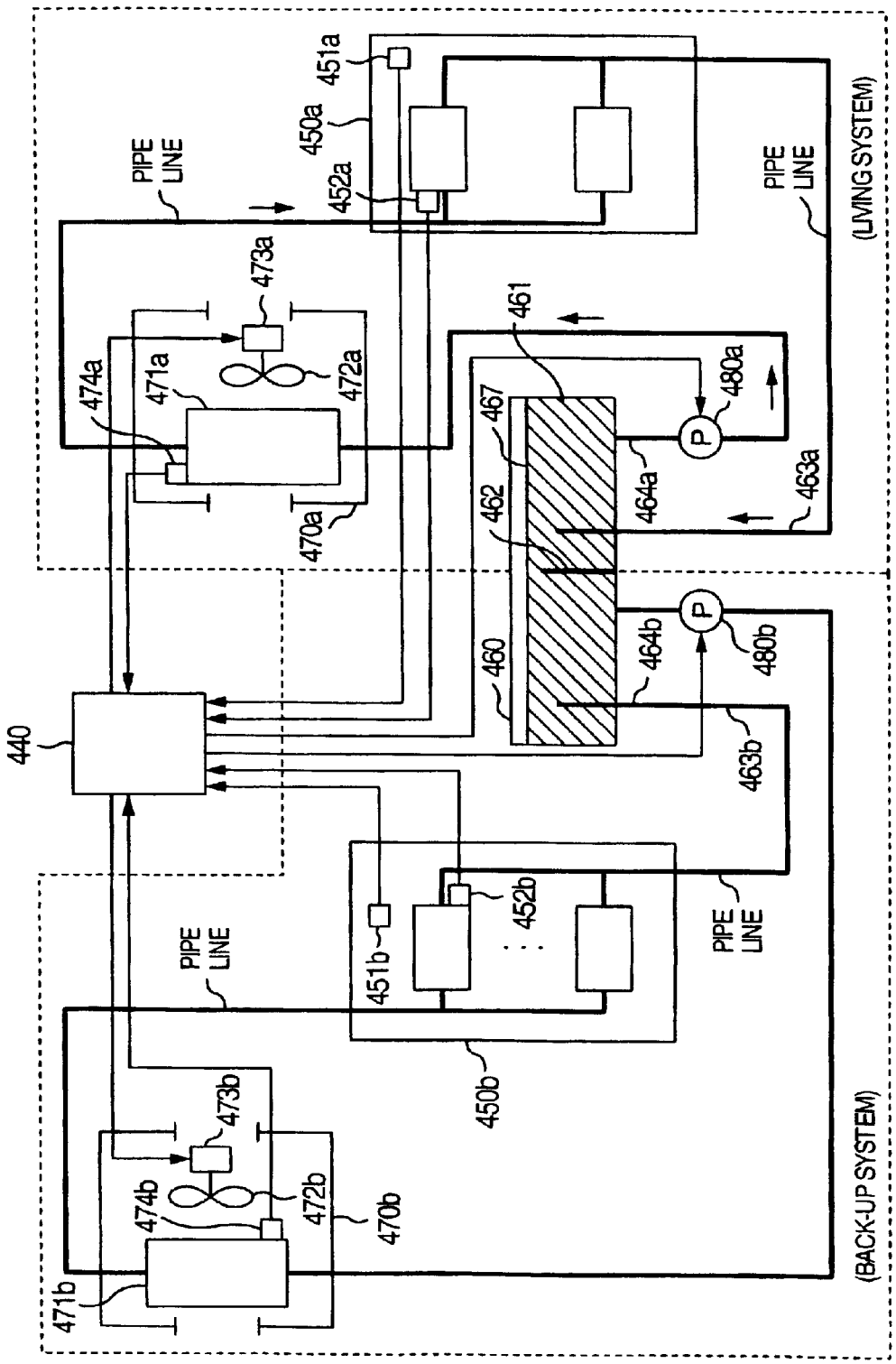
FIG. 19 is a view illustrating a variant form of the fifth embodiment of the present invention.

FIG. 19 shows a variant form of the fifth embodiment of the present invention. In the embodiment shown in FIG. 19, the direction of the circulation of the liquid coolant is different from that shown in FIG. 13, the liquid coolant is delivered from the tank 460 to the pump 480, and is then returned into the tank 460 by way of the electronic system 450. That is, the liquid coolant in the tank 460 is delivered into the pump 480 in the system on operation, and is then fed into the heat-exchanger 471 from the pump 480. Further, the liquid coolant having flown through the heat-exchanger 471 flows through a pipe line in the electronic system 450 and is then returned into the tank 460. With the direction of the circulation, the temperature of the liquid coolant in the tank 460 can be higher than that of the configuration shown in FIG. 13.

As stated above, since the tank 460 is commonly used for the two systems, the temperature of the liquid coolant flowing through the electronic system on the living side, is raised by the heat generating elements so as to be always higher than the temperature of the ambient air, and the liquid coolant up to the liquid surface 467 exceeding the upper edge of the partition panel 462 can flow into either one of the two systems. Thus, the temperature of the liquid coolant on the back-up side is efficiently raised by the liquid coolant from the living side whose temperature is higher, and accordingly, it can be higher than the temperature of the ambient air. Thereby it is possible to prevent occurrence of dewing or freezing on the back-up side.

Figure 20:
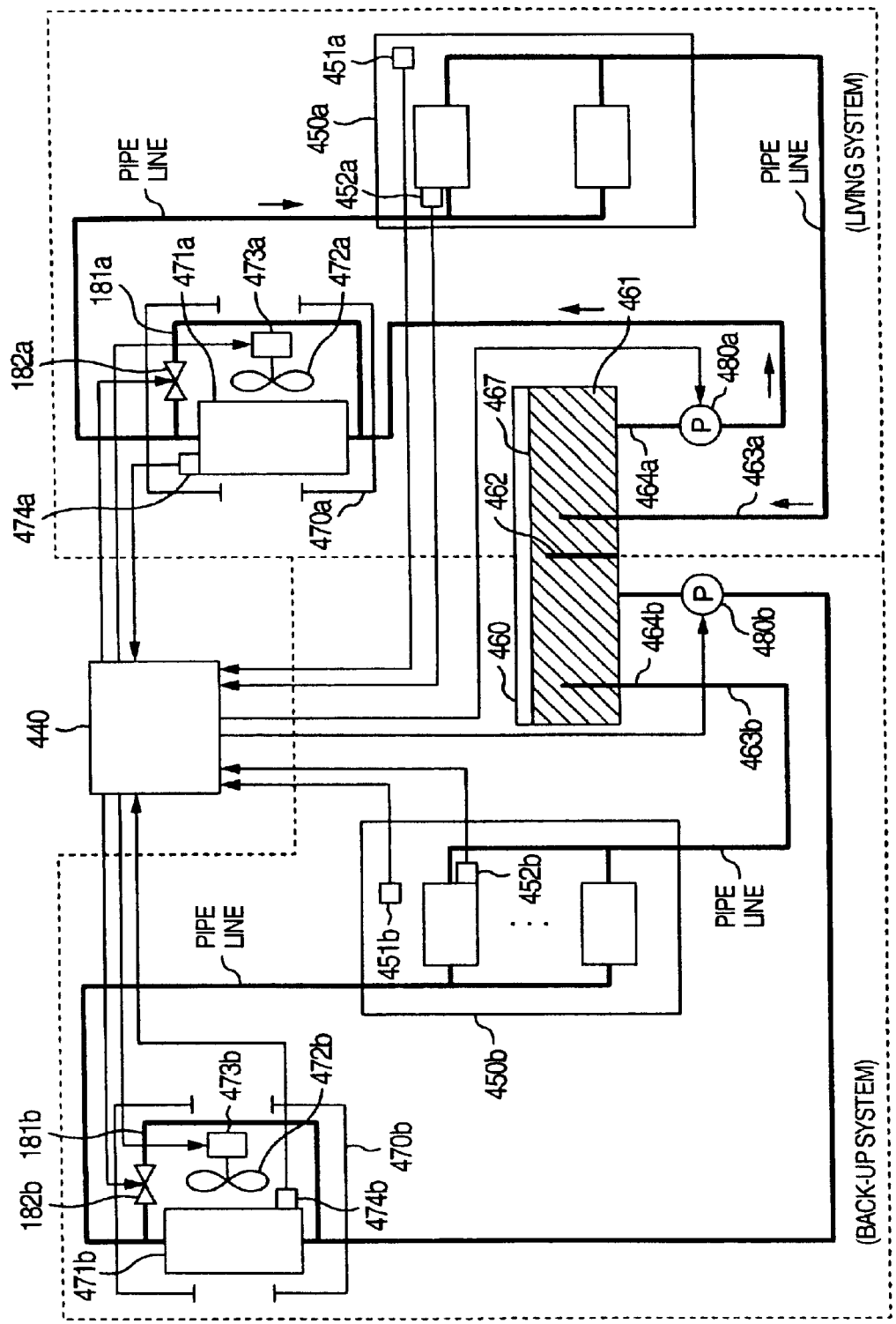
FIG. 20 is a view illustrating another variant form of the fifth embodiment of the present invention.

Explanation will be made of an example of the positional relationship between the inlet pipe line and the outlet pipe line to and from the tank 460. As to the inlet pipe line 460 shown in FIG. 14, the port of the inlet pipe line 463 is provided at a position which is near the partition panel 462 and which is slightly lower than the upper edge of the partition panel 462. Meanwhile, as to outlet pipe 464, the port of the outlet pipe line is provided at a position which is farther than the port of the inlet pipe line 463 from the partition panel 463, and which is in the bottom part of the tank 460. With the inlet and outlet pipe lines arranged as mentioned above, the liquid surface on the living side in the vicinity of the partition panel 462 is raised by the kinetic energy of the liquid coolant 461 introduced into the tank 460 from the inlet pipe line 463 on operation so as to be higher than the liquid surface on the back-up side on resting, thereby the flow of the liquid coolant from the living side into the back-up side is promoted, thereby the agitation in the tank 460 can be efficiently made. The embodiment shown in FIG. 20 is the same as that shown in FIG. 19, except that a bypass passage is provided for the heat-exchanger 471. Thus, the liquid coolant is led through the bypass passage without feeding the liquid coolant through the heat-exchanger 471 in accordance with a temperature condition, thereby it is possible to suitably control the temperature. The control of the temperature in this embodiment can be made precisely and widely, in comparison with that of the configuration shown in FIG. 13 or FIG. 19.

During the operation of the living system, when temperatures detected by the temperature detectors 474a, 452a becomes greater than a threshold value, the controller 440 opens the bypass valve 182a so as to lower the capacity of the heat-exchanger 471a in the heat-exchanger unit 470a. On the contrary, the detected temperatures are higher than the threshold value, the controller 440 closes the bypass valve 182a so as to increase the capacity of the heat-exchanger 471a in the heat-exchanger unit 470a. Further, during the operation of the back-up system, the controller 440 controls a bypass valve 182b in the bypass passage 181b in accordance with temperatures detected by the temperature detectors 474a, 452b. By passing the liquid coolant through the bypass passages 181a or 181b in accordance with a temperature condition without passing the same through the heat-exchangers 471a, 471b, the temperature control can be made, thereby it is possible to precisely control the temperature in comparison with the configuration shown in FIG. 19 or 13.

It goes without saying that any positional relationship between the pipe lines other than that mentioned above may be taken in order to enhance the above-mentioned agitation within the scope of the present invention.

With the configuration as stated above, the temperature of the liquid coolant on the back-up side in the tank 460 can be increased so as to be higher than the temperature of the ambient air. In order to prevent occurrence of freezing in any of the pipe lines on the back-up side when the temperature of the ambient air is lowered, a temperature of the liquid coolant in the heat-exchanger unit 470 is detected by the temperature detector 474, and if the controller 440 which receives the temperature detected by the detector 474, determines from the temperature that the temperature of the liquid coolant becomes lower than a temperature at which an alarm for freezing is issued, the controller 440 carries out such control that the pump 480 on the back-up side on resting is driven. Thus, the pump 480 on the back-up side is intermittently operated in a predetermined period or in a period in which the temperature detected by the temperature detector 474 become not less than a predetermined temperature. Thus, the liquid coolant 461 on the back-up side in the tank 460, having a raised temperature is circulated through the back-up system so that the temperature of the liquid coolant in the pipe lines is increased, thereby it is possible to prevent occurrence of freezing.

Similarly, in the case of lowering of the temperature of the ambient air so that the temperature of the liquid coolant in the pipe lines on the back-up side is lowered, if the condition of dewing in the electronic system 450 is satisfied, when the shifting of the operation is made from the living side to the back-up side in this condition, dewing occurs in the electronic system 450 so as to hinder the operation of the electronic system 450. Thus, in order to prevent occurrence of dewing, the atmospheric temperature in the electronic system 450 within a housing is detected by the temperature detector 451, and the temperature of the liquid coolant in the cooling pipe in the electronic system 450 is detected by the temperature detector 452. Then, the thus detected temperatures are delivered to the controller 440 which therefore determines in view of the temperatures whether the condition of dewing in the electronic system 450 is satisfied or not. If it is determined that the dewing condition is satisfied, the pump 480 on the back-up side is intermittently operated in a non-operating condition so as to circulate the liquid coolant having a raised temperature in the tank 460 in order to increase the temperature of the liquid coolant in the electronic system 450 up to a value higher than the dewing temperature. Accordingly, no dewing condition is established, thereby it is possible to prevent the occurrence of dewing.

Figure 21:
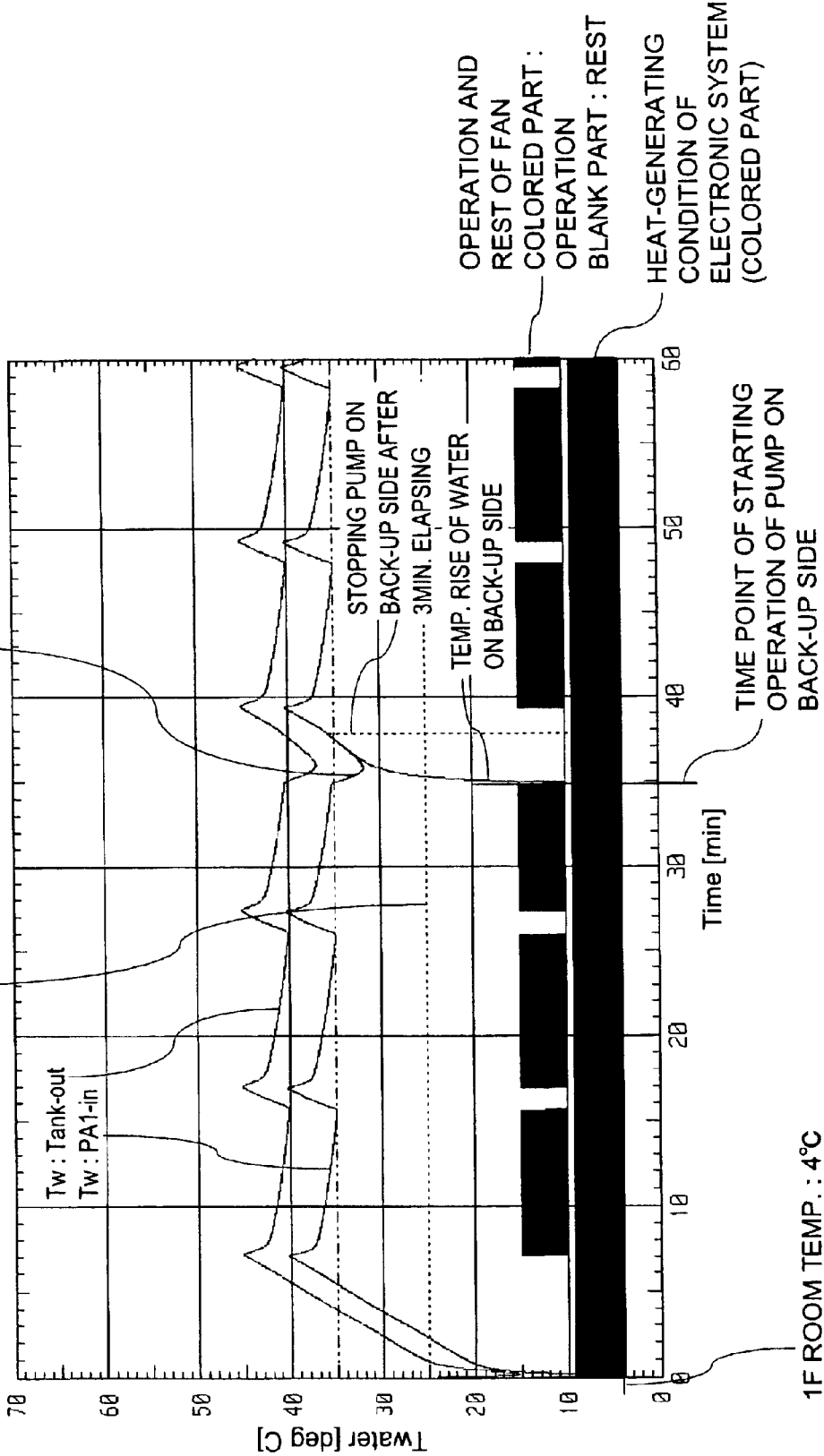
FIG. 21 is a view for explaining a temperature of a cooling apparatus according to the present invention upon change-over of operation.
Figure 22:
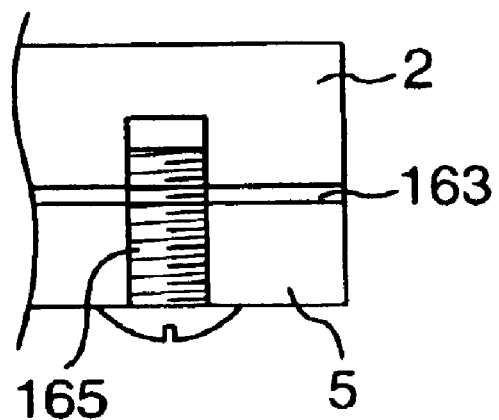
FIG. 22 is a view for explaining a cooling structure according to the present invention.

FIG. 21 is a simulation of a temperature control condition in the embodiment shown in FIG. 19. In this case, water was used as the liquid coolant 461. In the used apparatus, the living system generated a heat corresponding to a heat power of 21 KW, and the cooling water 461 was always circulated at a flow rate of 60 l/min. Estimation was made such that the pump 480 had a heat loss corresponding to a heat power of 1 KW which is absorbed by the cooling water 461. The reserving capacity of the tank 460 was 60 l while 10.5 l of water was reserved in the heat-exchanger 471 and the pipe line while 8.2 l of water was held in the electronic system. The electronic device 450 and the tank 460 was located in a place having a room temperature of 4 deg. C.

In this condition, when the living system alone was operated, the cooling water whose temperature was raised by a heat generated by the electronic system 450 flew into the tank 460, and was then mixed with cooling water in the tank 460. Thus, the temperature Tw (Tw: Tank-Out) of the cooling water was increased at the outlet port of the tank 460. The cooling water discharged from the tank 460 was cooled in the heat-exchanger 471, and the temperature (Tw: PA1-in) of the cooling water flowing into the electronic device 450 was increased in proportion to an increase in the temperature of the cooling water at the outlet of the tank 460.

If the temperature of the cooling water flowing into the electronic device 450 was not greater than 40 deg. C., the fan 472a was stopped, but since the generation of heat by the electronic system 450 was continued, the temperature (Tw: PA1-in) of the cooling water was continuously raised. When the temperature of the cooling water came up to 40 deg. C., the rotation of the fan 472 in the heat-exchanger unit was started. An operating condition and a stop condition were shown in FIG. 21. With the result of rotation of the fan 472, the temperature of the cooling water was lowered. When the temperature is lowered so as to below the 35 deg. C., the fan 472a comes to a stop. With the repetitions of the above-mentioned operation, the temperature (Tw: PA1-in) of the cooling water was stably controlled in a range from 35 to 40 deg. C.

Meanwhile, when the temperature of the ambient air was lowered, the temperature of the cooling water in the back-up system came down to a value at which the cooling water was frozen. It was estimated that the temperature at which the cooling water was frozen is 4 deg. C. Thus, if the temperature (Tw: PA2-In) of the cooling water on the back-up side became lower than 4 deg. C., only the pump 480 on the back-up side was operated (at a time point of 35 min. in FIG. 19). Just after the start of the operation of the pump 480, the cooling water having a low temperature on the back-up side flew into the tank 460 in which the temperature of cooling water was high, and accordingly, the temperature (Tw: Tank-Out) at the outlet of the tank 460 was lowered. However, even though the temperature of the cooling water in the tank 460 was lowered, the heat capacity of the cooling water reserved in the tank 460 was large, and further, the heat generation of the living system was continued. Accordingly, the temperature of the cooling water in the tank 460 did not become lower than the dewing temperature of 25 deg. C. Thus, no dewing occurred.

At this stage, due to the heat generation of the living system, the temperature of the cooling water was continuously increased. Thus, the mixed cooling water having a high temperature in the tank 460 could warm up the pipe line, the pump 480 and the heat-exchanger 471 on the back-up side.

During the warm-up, after three minutes elapsed, the pump 480 on the back-up side was stopped in order to prevent the consumption power from being excessive. The warmed-up cooling water on the back-up side was left in the pipe line, the heat-exchanger 471 and the electronic system 450 on the back-up side as it was, and accordingly, the temperature of the cooling water was gradually lowered. When it came to a temperature (4 deg. C.) at which the cooling water was possibly frozen, the operation of the pump 480 on the back-up side was started. Thereafter, intermittent operation of the pump 480 on the back-up side were successively repeated.

It is noted that FIG. 21 does not show such a phenomenon that the temperature of the cooling water on the back-up side which is warmed up to about 35 deg. C. is lowered through natural heat transfer.

Thus, with the above-mentioned simulations, it was found that the cooling apparatus according to the present invention enables energy saving and prevention of occurrence of dewing and freezing.

It is noted that the heat-exchanger unit 470 on the back-up side is rested during the above-mentioned intermittent operation, thereby it is possible to aim at preventing occurrence of freezing or dewing and at efficiently saving energy.

As mentioned above, according to the fifth embodiment of the present invention, the-highly efficient liquid cooling apparatus having two systems, the living system and the back-up system, each comprising a heat-exchanger unit for expelling heat absorbed from the heat generating elements, a pump for circulating liquid coolant for cooling the heat generating elements, a tank for reserving the liquid coolant and pipe lines connecting the former components, wherein the heat-generating elements being cooled by the liquid coolant flowing through the pipe lines, the tank in the living system and the tank in the back-up system are integrally incorporated with each other so as to form a single common unit tank in which a partition panel is provided. With this configuration, the tank is served as a unit tank in which the living side tank and the back-up side are integrally incorporated with each other during normal operation, and accordingly, the liquid coolant having a higher temperature on the living side tank is efficiently circulated into the back-up side tank so as to allow the temperature of the liquid coolant on the back-up side to approach the temperature on the living side in order to prevent occurrence of dewing and freezing. Further, with the provision of the partition panel, if leakage of the liquid coolant is happened, the liquid coolant on the back-up side is held in the back-up side tank by means of the partition panel so as to materialize the dual systems. Further, the necessity of nonfreezing fluid can be eliminated so as to enhance the cooling characteristic and the reliability of the apparatus while the environmental pollution by the apparatus can be prevented, thereby it is possible to aim at making the miniaturization of the apparatus and at reducing the weight. Thus, it is possible to aim at saving energy.

What is claimed is:

1. An electronic apparatus having a cooling apparatus comprising:
   a plurality of electronic parts to be cooled;
   a cooling pipe laid along each of said electronic parts, for feeding therethrough liquid coolant, said cooling pipe having at least two flattened portions and a plurality of circular portions, said flattened portions and said circular portions being alternately arranged to each other;
   a plurality of heat conductive members, each of which is coupled with each of said flattened portions, for radiating heat generated from each of said electronic parts;
   a supply means for feeding said liquid coolant into said cooling pipe with a predetermined flow velocity of said liguid coolant;
   wherein a plurality of said electronic parts are respectively coupled to said flattened portions of the cooling pipe through each of said heat conductive members and said flow velocity of said liguid coolant is increases at each of said flattened portions of said cooling pipe.

2. An electronic apparatus according to claim 1, wherein said cooling pipe comprises a first pipe portion having a circular cross-sectional shape and a second pipe portion having a flattened cross-sectional shape, and a bent part of said cooling pipe and a pipe portion other than the pipe portion coupled with said heat conductive member are formed of said first pipe portion.

3. An electronic apparatus according to claim 2, wherein the cross-sectional area of said second pipe portion of said cooling pipe is smaller than that of said first pipe portion, and the cross-sectional area of an intermediate part therebetween is gradually changed from said first pipe portion to said second pipe portion.

4. An electronic apparatus according to claim 3, wherein said first pipe portion of said cooling pipe is integrally incorporated with said second pipe portion thereof.

5. An electronic apparatus according to claim 2, further comprising a circuit board, to which said electronic parts are mounted, said circuit board being coupled with said second pipe portion of said cooling pipe through said heat conductive member, and the positions of said electronic parts mounted on said circuit board are corresponding to the position coupled with said second pipe portion of said cooling pipe.

6. An electronic apparatus according to claim 5, wherein said heat conductive member has a hollow, said second pipe portion of said cooling pipe being coupled with the hollow of said heat conductive member.

7. A cooling apparatus for an electronic system comprising;
   a first temperature detector;
   electronic parts to be cooled;
   a cooling pipe through which a liquid coolant flows, and which is coupled with said electronic parts, said liquid coolant absorbing heat from said electronic parts;
   conductive members coupled with said cooling pipe for transmitting heat generated from said electronic parts to said liquid coolant;
   a heat-exchanger unit coupled with said cooling pipe for radiating heat from said liguid coolant;
   a pump for circulating said liquid coolant in said cooling pipe for cooling said electronic parts;
   a tank for reserving said liquid coolant; and
   a control unit for controlling an operation of said heat-exchanger unit in response to a signal from said first temperature detector.

8. A cooling apparatus according to claim 7, wherein said first temperature detector is provided in the outside portion of said heat-exchanger unit to detect an outside temperature of said heat-exchanger unit.

9. Cooling apparatus as set forth in claim 8, further comprising a second temperature detector provided adjacent to said electronic parts, wherein said control unit controls the rate between a turn-on operation and a turn-off operation of a power source for said-heat exchanger unit so that the at least either one of temperatures detected by the first temperature detector and the second temperature detector falls within a predetermined temperature range.

10. A cooling apparatus as set forth in claim 9, wherein the controller controls the capacity of the heat-exchanger unit in response to outputs from said first and second temperature detectors so that the heat-exchange capacity becomes relatively small, relatively middle, relatively small, or extremely small due to a stop of operation of said heat-exchanger unit.

11. A cooling apparatus for an electronic system, comprising:
   temperature detecting means;
   electronic parts to be cooled;
   a heat-exchanger unit for radiating heat absorbed from the electronic parts in order to cool said electronic parts;
   a pump for circulating liquid coolant for cooling the electronic parts;
   a tank for reserving the liquid coolant;
   a cooling pipe through which the liquid coolant flows, and which is placed adjacent to the electronic parts so as to cool the latter; and
   a control unit for controlling said heat-exchanger unit in response to an output from said temperature detecting means; and
   wherein the heat-exchanger unit further comprises:
      a heat-exchanger for radiating heat from the liquid coolant into an outside portion of the heat-exchanger unit;

a fan blowing said outside air into the heat-exchanger;
a duct for discharging air warmed up by the heat-exchanger, into the outside;
a damper provided to the wall surface of the duct; and
a motor for controlling the opening and closing of the damper,
wherein such a control that the warmed-up air can be recirculated into the cooling apparatus.

12. A cooling apparatus as set forth in claim 11, wherein said temperature detecting means comprises a first temperature detector provided in an outside portion of the heat-exchanger unit, and a second temperature detector provided adjacent to the electronic parts; wherein the opening and closing of the damper are controlled in accordance with a temperature difference between temperatures detected by the first and second temperature detectors.

13. A cooling apparatus as set forth in claim 11, wherein said temperature detecting means comprises a first temperature detector provided in an outside portion of the heat-exchanger unit, and a second temperature detector provided in the cooling apparatus; wherein the opening and closing of the damper are controlled in accordance with a temperature difference between temperatures detected by the first and second temperature detectors.

14. A cooling apparatus for an electronic system, including two cooling systems each comprising:
electronic parts to be cooled;
a cooling pipe placed adjacent to the electronic parts, for feeding therethrough liquid coolant;
a tank for reserving the liquid coolant;
a supply means for feeding the liquid coolant into the cooling pipe;
a heat-exchanger unit for radiating heat from the liquid coolant in the cooling pipe into an outside portion of the heat-exchanger unit;
a first temperature detector provided in the outside portion of said heat-exchanger unit;
a controller for controlling the heat-exchanger unit in response to a signal from said first temperature detector;
wherein the heat-exchanger unit comprises a heat-exchanger for transferring heat from the liquid coolant into the outside portion, a fan for blowing air from said outside portion into the heat-exchanger, a duct for introducing the air warmed up by the heat-exchanger into the outside, a damper provided in the wall surface of the duct, and a motor for controlling the opening and closing of the damper.

15. A cooling apparatus as set forth in claim 14, wherein the two cooling systems are a first cooling system in which the electronic parts are operated so as to generate heat and a second cooling system in which the electronic parts are not operated, the opening and closing of the damper are controlled in accordance with either one of a temperature of the liquid coolant in the second cooling system, a temperature of the cooling apparatus and a temperature difference between the liquid coolant in the second cooling system and the temperature in the cooling apparatus so that the warmed-up air is recirculated within said cooling apparatus.

16. A cooling apparatus as set forth in claim 14, where the cooling fan in the heat-exchanger unit in the second cooling system in which the electronic part is deenergized is not operated.

17. A cooling apparatus for an electronic system, including two cooling systems each comprising:
electronic parts to be cooled;
a cooling pipe through which a liguid coolant flows, and which is coupled with the electronic parts, said liquid coolant absorbing heat from said electronic parts;
a tank for reserving said liquid coolant;
a supply means for feeding the liquid coolant into the cooling pipe with a predetermined flow velocity of said liguid coolant;
a heat-exchanger unit coupled with said cooling pipe for radiating heat from the liquid coolant in the cooling pipe into an outside portion of the heat-exchanger unit;
a first temperature detector provided in the outside portion of said heat-exchanger unit to detect an outside temperature of said heat-exchanger unit;
a controller for controlling the heat-exchange capacity of the heat-exchanger unit in response to a signal of said first temperature detector;
wherein said tank is coupled with cooling pipes of said two cooling systems and said liquid coolant in said tank is commonly used for the two cooling systems.

18. A cooling apparatus as set forth in claim 17, wherein of said two cooling systems, the one operates so as to continuously flow the liquid coolant to continuously flow therethrough, and the other one operates so as to intermittently flow the liquid coolant in order to prevent the occurrence of freezing or dewing relating to the cooling system on resting.

19. A cooling apparatus including two cooling systems each comprising:
electronic parts to be cooled;
a cooling pipe through which a liquid coolant flows, and which is coupled with the electronic parts, said liquid coolant absorbing heat from said electronic parts;
a tank for reserving said liquid coolant;
a supply means for feeding the liquid coolant into the cooling pipe with a predetermined flow velocity of said liquid coolant;
a heat-exchanger unit coupled with said cooling pipe for radiating heat from the liquid coolant in the cooling pipe into an outside portion of the heat-exchanger unit;
a first temperature detector provided in the outside portion of said heat-exchanger detector unit to detect an outside temperature of said heat-exchanger unit;
a controller for controlling the heat-exchange capacity of the heat-exchanger unit in response to a signal of said first temperature detector;
wherein said tank is provided with a partition panel for holding the liquid coolant for the respective two cooling systems.

20. A cooling apparatus as set forth in claim 19, wherein the partition panel provided in the tank, partitions the inside of the tank while the upper portion thereof is opened free so that the liquid coolant can flow into either one of the two cooling systems.

21. A cooling apparatus as set forth in claim 20, wherein an inlet pipe line into the tank is positioned so that a portion thereof is located relatively near to the partition panel at a level lower than the upper edge of the partition panel, and an outlet pipe from the tank is positioned so that a port thereof is located relatively far from the partition panel and is in the bottom part of the tank so that the liquid coolant which exceeds the upper edge of the partition panel by the kinetic energy of the liquid coolant flowing from the portion, can flow into either one of the two cooling systems.

* * * * *